(12) United States Patent
Hatakeyama et al.

(10) Patent No.: US 8,338,078 B2
(45) Date of Patent: Dec. 25, 2012

(54) PHOTORESIST UNDERCOAT-FORMING MATERIAL AND PATTERNING PROCESS

(75) Inventors: Jun Hatakeyama, Joetsu (JP); Toshihiko Fujii, Joetsu (JP); Takeru Watanabe, Joetsu (JP); Youichi Ohsawa, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 401 days.

(21) Appl. No.: 12/581,625

(22) Filed: Oct. 19, 2009

(65) Prior Publication Data

US 2010/0104977 A1   Apr. 29, 2010

(30) Foreign Application Priority Data

Oct. 28, 2008   (JP) .................. 2008-276510

(51) Int. Cl.
- G03F 7/09 (2006.01)
- G03F 7/20 (2006.01)
- G03F 7/30 (2006.01)
- G03F 7/36 (2006.01)
- G03C 1/76 (2006.01)

(52) U.S. Cl. .......... 430/271.1; 430/272.1; 430/311; 430/313; 430/317; 430/323; 430/325; 430/326

(58) Field of Classification Search .......... None
See application file for complete search history.

(56) References Cited

U.S. PATENT DOCUMENTS

| | | | |
|---|---|---|---|
| 5,972,560 A | 10/1999 | Kaneko et al. | |
| 6,042,989 A | 3/2000 | Schaedeli et al. | |
| 6,309,796 B1 | 10/2001 | Nakashima et al. | |
| 6,420,088 B1 | 7/2002 | Angelopoulos et al. | |
| 6,506,497 B1 | 1/2003 | Kennedy et al. | |
| 6,730,453 B2 | 5/2004 | Nakashima et al. | |
| 7,238,462 B2 | 7/2007 | Nakamura et al. | |
| 2002/0012871 A1 | 1/2002 | Hatakeyama et al. | |
| 2002/0086934 A1 | 7/2002 | Kawaguchi et al. | |
| 2006/0183879 A1 | 8/2006 | Yamato et al. | |
| 2008/0032231 A1 | 2/2008 | Hatakeyama et al. | |
| 2008/0038662 A1 | 2/2008 | Hatakeyama et al. | |

FOREIGN PATENT DOCUMENTS

| | | | |
|---|---|---|---|
| JP | 2-173748 | * | 7/1990 |
| JP | 5-017186 A | | 1/1993 |
| JP | 6-118651 A | | 4/1994 |
| JP | 9-110938 A | | 4/1997 |
| JP | 10-324748 A | | 12/1998 |
| JP | 11-302382 A | | 11/1999 |
| JP | 2001-040293 A | | 2/2001 |

(Continued)

OTHER PUBLICATIONS

Derwent English abstract for JP2008-3638 (2008).*

(Continued)

*Primary Examiner* — Sin J. Lee

(74) *Attorney, Agent, or Firm* — Westerman, Hattori, Daniels & Adrian, LLP

(57) ABSTRACT

A material comprising a novolac resin having a $C_6$-$C_{30}$ aromatic hydrocarbon group substituted with a sulfo group or an amine salt thereof is useful in forming a photoresist undercoat. The undercoat-forming material has an extinction coefficient sufficient to provide an antireflective effect at a thickness of at least 200 nm, and a high etching resistance as demonstrated by slow etching rates with $CF_4/CHF_3$ gas for substrate processing.

12 Claims, 5 Drawing Sheets

FOREIGN PATENT DOCUMENTS

| | | |
|---|---|---|
| JP | 2002-014474 A | 1/2002 |
| JP | 2002-055456 A | 2/2002 |
| JP | 2002-214777 A | 7/2002 |
| JP | 2004-177666 A | 6/2004 |
| JP | 2006-233210 A | 9/2006 |
| JP | 2008-3638 * | 1/2008 |
| JP | 2008-039811 A | 2/2008 |
| JP | 2008-039815 A | 2/2008 |
| JP | 2008-065303 A | 3/2008 |

OTHER PUBLICATIONS

Machine-assisted English translation of JP2008-3638 (2008).*

Derwent English abstract for JP 2-173748 (1990).*

English translation of Harita et al (JP2-173748), provided by JPO (1990).*

W. Brunsvold et al., "Evaluation of a Deep UV Bilayer Resist for Sub-Half Micron Lithography," SPIE vol. 1925. 1993. p. 377.

U. Schaedeli et al., "Evaluation of Materials for 193-nm Lithography," Journal of Photopolymer Science and Technology, vol. 9, No. 3, 1996. pp. 435-446.

J. M. Moran et al., "High Resolution, Steep Profile Resist Patterns," Journal of Vacuum Science and Technology, vol. 16, No. 6, Dec. 1979, (p. 1620-1624).

R. Kwong et al., "IBM 193nm Bilayer Resist: Materials, Lithographic Performance and Optimization," SPIE, col. 4345, 2001, (p. 50-57).

J. Hatakeyama et al. "Investigation of Discrimination Enhancement in Polysilsesquioxane Based Positive Resist for ArF Lithography," SPIE, vol. 3333, p. 62-72, (1998).

T. Lynch et al. "Properties and Performance of Near UV Reflectivity Control Layers," SPIE, vol. 2195, p. 225-235, (1994).

S. Burns et al., "Silicon Containing Polymer in Application for 193nm High NA Lithography Processes," SPIE, col. 6153, p. 61530K-1-61530K-12, (2006).

* cited by examiner

SUBSTRATE REFLECTANCE
INTERMEDIATE LAYER, n=1.5, VARIABLE k

INTERMEDIATE LAYER THICKNESS (nm)

☐ 0-1  ▨ 1-2  ▨ 2-3  ▨ 3-4  ■ 4-5    SUBSTRATE REFLECTANCE (%)

SUBSTRATE REFLECTANCE
INTERMEDIATE LAYER n=1.5, k=0.1
UNDERCOAT FILM n=1.5, k=0.2

UNDERCOAT FILM THICKNESS (nm)

☐ 0-1  ▨ 1-2  ▨ 2-3  ▨ 3-4  ■ 4-5    SUBSTRATE REFLECTANCE (%)

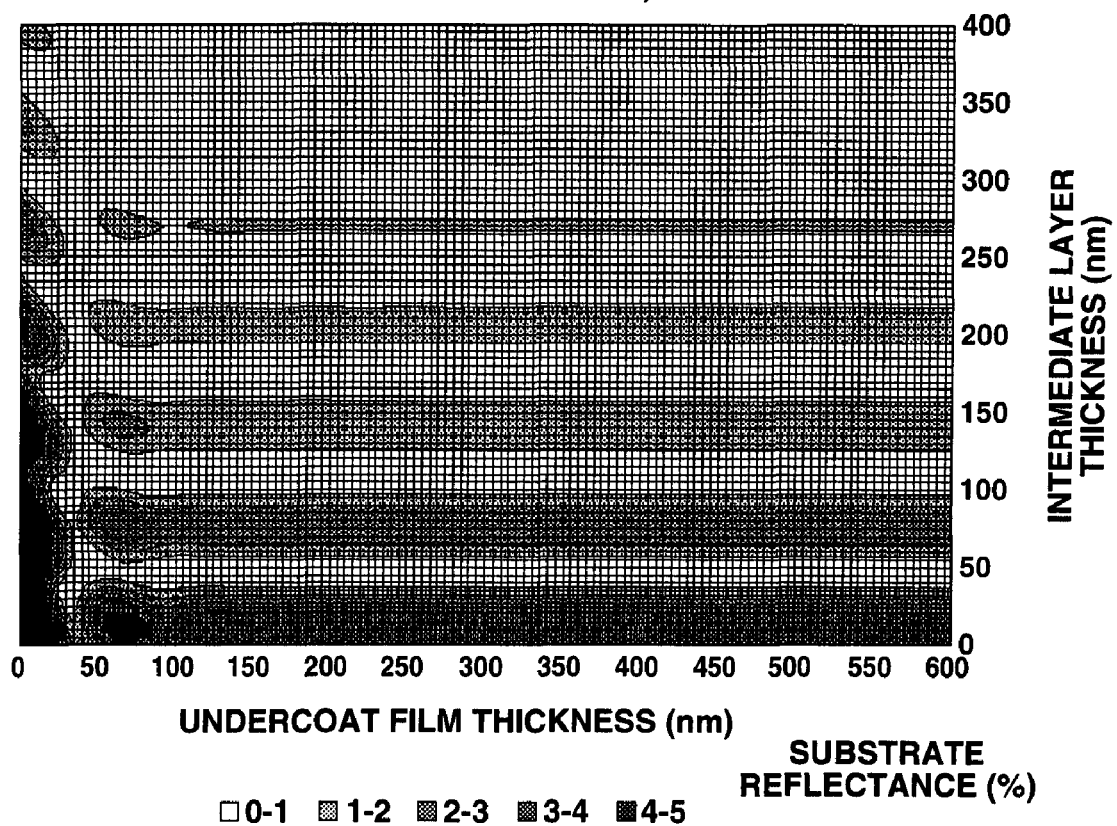

PHOTORESIST UNDERCOAT-FORMING MATERIAL AND PATTERNING PROCESS

CROSS-REFERENCE TO RELATED APPLICATION

This non-provisional application claims priority under 35 U.S.C. §119(a) on Patent Application No. 2008-276510 filed in Japan on Oct. 28, 2008, the entire contents of which are hereby incorporated by reference.

TECHNICAL FIELD

This invention relates to an undercoat-forming material useful in the multilayer resist process used in micropatterning for the fabrication of semiconductor devices or the like, and more particularly, to an undercoat-forming material useful in a lithographic process adapted for exposure to KrF excimer laser (248 nm), ArF excimer laser (193 nm), $F_2$ laser (157 nm), $Kr_2$ laser (146 nm), $Ar_2$ laser (126 nm), soft X-ray (EUV), electron beam (EB), ion beam or X-ray; and a resist pattern-forming process using the same.

BACKGROUND ART

While a number of recent efforts are being made to achieve a finer pattern rule in the drive for higher integration and operating speeds in LSI devices, the commonly used light exposure lithography is approaching the essential limit of resolution determined by the light source wavelength.

As the light source used in the lithography for resist pattern formation, g-line (436 nm) or i-line (365 nm) from a mercury lamp has been widely used. One means believed effective for further reducing the feature size is to reduce the wavelength of exposure light. For the mass production process of 64 M-bit DRAM, the exposure light source of i-line (365 nm) was replaced by a KrF excimer laser having a shorter wavelength of 248 nm. However, for the fabrication of DRAM with a degree of integration of 1 G or more requiring a finer patterning technology (processing feature size 0.13 μm or less), a shorter wavelength light source is required. In particular, photolithography using ArF excimer laser light (193 nm) is now under investigation.

On the other hand, it is known in the art that the bilayer resist process is advantageous in forming a high-aspect ratio pattern on a stepped substrate. In order that a bilayer resist film be developable with a common alkaline developer, high molecular weight silicone compounds having hydrophilic groups such as hydroxyl and carboxyl groups must be used.

Among silicone base chemically amplified positive resist compositions, recently proposed were those compositions for KrF excimer laser exposure comprising a base resin in the form of polyhydroxybenzylsilsesquioxane, which is a stable alkali-soluble silicone polymer, in which some phenolic hydroxyl groups are protected with t-BOC groups, in combination with an acid generator (see JP-A 6-118651 and SPIE vol. 1925 (1993), p 377). For ArF excimer laser exposure, positive resist compositions comprising as a base a silsesquioxane of the type in which cyclohexylcarboxylic acid has substituted thereon an acid labile group were proposed (see JP-A 10-324748, JP-A 11-302382, and SPIE vol. 3333 (1998), p 62). For $F_2$ laser exposure, positive resist compositions based on a silsesquioxane having hexafluoroisopropanol as a dissolvable group were proposed (see JP-A 2002-55456). The above polymer bears in its backbone a polysilsesquioxane containing a ladder skeleton produced through polycondensation of a trialkoxysilane or trihalosilane.

Silicon-containing (meth)acrylate polymers were proposed as a resist base polymer having silicon pendants on side chains (see JP-A 9-110938, J. Photopolymer Sci. and Technol., Vol. 9, No. 3 (1996), p 435-446).

The undercoat (or bottom) layer of the bilayer resist process is formed of a hydrocarbon compound which can be etched with oxygen gas, and must have high etching resistance since it serves as a mask when the underlying substrate is subsequently etched. For oxygen gas etching, the undercoat layer must be formed solely of a silicon atom-free hydrocarbon. To improve the line-width controllability of the upper (or top) layer of silicon-containing resist and to minimize the sidewall corrugation and pattern collapse by standing waves, the undercoat layer must also have the function of an antireflective coating (ARC). Specifically, the reflectance from the undercoat layer back into the resist film must be reduced to below 1%.

Now, the results of calculation of reflectance at film thickness varying up to the maximum of 500 nm are shown in FIGS. 1 and 2. Assume that the exposure tool has an exposure wavelength of 193 nm, an NA of 0.85, ⅔ annular illumination, and a 6% halftone phase shift mask, and is designed to form a 80-nm line-and-space pattern, and the topcoat resist has an n value of 1.74 and a k value of 0.02. FIG. 1 shows substrate reflectance when the undercoat layer has a fixed k value of 0.3, the n value varies from 1.0 to 2.0 on the ordinate and the film thickness varies from 0 to 500 nm on the abscissa. Assuming that the undercoat layer of the bilayer resist process has a thickness of 300 nm or greater, optimum values at which the reflectance is reduced to or below 1% exist in the refractive index (n) range of 1.6 to 1.9 which is approximate to or slightly higher than that of the topcoat resist.

FIG. 2 shows substrate reflectance when the undercoat layer has a fixed n value of 1.5 and the k value varies from 0.1 to 0.8. In the k value range of 0.24 to 0.15, the reflectance can be reduced to or below 1%. By contrast, the antireflective coating used in the form of a thin film of about 40 nm thick in the single-layer resist process has an optimum k value in the range of 0.4 to 0.5, which differs from the optimum k value of the undercoat layer used with a thickness of 300 nm or greater in the bilayer resist process. For the undercoat layer in the bilayer resist process, an undercoat layer having a lower k value, that is, more transparent is necessary.

As the material for forming an undercoat layer in 193 nm lithography, copolymers of polyhydroxystyrene with acrylates are under study as described in SPIE Vol. 4345 (2001) p 50. Polyhydroxystyrene has a very strong absorption at 193 nm and its k value is as high as around 0.6 by itself. By copolymerizing with an acrylic compound having a k value of almost 0, the k value of the copolymer is adjusted to around 0.25.

However, the resistance of the acrylic polymer to substrate etching is weak as compared with polyhydroxystyrene, and a considerable proportion of the acrylic compound must be copolymerized in order to reduce the k value. As a result, the resistance to substrate etching is considerably reduced. The etching resistance is not only reflected by the etching speed, but also evidenced by the development of surface roughness after etching. Through copolymerization of acrylic compound, the surface roughness after etching is increased to a level of serious concern.

Naphthalene ring is one of rings that have a more transparency at 193 nm and a higher etching resistance than benzene ring. JP-A 2002-14474 proposes an undercoat layer having a naphthalene or anthracene ring. However, since naphthol-copolycondensed novolac resin and polyvinyl naphthalene resin have k values in the range of 0.3 to 0.4, the target transparency corresponding to a k value of 0.1 to 0.3 is not reached, with a further improvement in transparency being necessary. The naphthol-copolycondensed novolac resin and polyvinyl naphthalene resin have low n values at 193 nm, as evidenced by a value of 1.4 for the naphthol-copolycondensed novolac resin and a value of only 1.2 for the polyvinyl naphthalene resin when the inventors measured. JP-A 2001-40293 and JP-A 2002-214777 describe acenaphthylene polymers which have lower n values and higher k values at the wavelength of 193 nm than at 248 nm, both falling outside the target values. There is a need for an undercoat layer having a high n value, a low k value, transparency and high etching resistance.

Also proposed was a tri-layer process of stacking a silicon-free single-layer resist as a topcoat, an intermediate layer containing silicon below the resist, and an organic undercoat below the intermediate layer. See J. Vac. Sci. Technol., 16(6), November/December 1979. Since the single-layer resist generally provides better resolution than the silicon-bearing resist, the tri-layer process permits such a high resolution single-layer resist to be used as an imaging layer for light exposure. A spin-on-glass (SOG) coating is used as the intermediate layer. A number of SOG coatings have been proposed.

In the trilayer process, the optimum optical constants of the undercoat layer for controlling reflection from the substrate are different from those in the bilayer process. The purpose of minimizing substrate reflection, specifically to a level of 1% or less is the same between the bi- and tri-layer processes. In the bilayer process, only the undercoat layer is endowed with the antireflective effect. In the tri-layer process, either one or both of the intermediate layer and the undercoat layer may be endowed with the antireflective effect.

U.S. Pat. No. 6,506,497 and U.S. Pat. No. 6,420,088 disclose silicon-containing layer materials endowed with antireflective effect. In general, a multi-layer antireflective coating has greater antireflective effect than a single-layer antireflective coating and commercially widely used as an antireflective film for optical articles. A higher antireflective effect is obtainable by imparting an antireflective effect to both an intermediate layer and an undercoat layer. If the silicon-containing intermediate layer in the trilayer process is endowed with the function of ARC, the undercoat layer need not necessarily possess the maximum function of ARC. In the trilayer process, the undercoat layer is required to have high etching resistance during substrate processing rather than the ARC function. Then a novolac resin having high etching resistance and containing more aromatic groups must be used as the undercoat layer in the trilayer process.

FIG. 3 illustrates substrate reflectance with a change of the k value of the intermediate layer. It is seen that by setting a k value as low as 0.2 or less and an appropriate thickness to the intermediate layer, a satisfactory antireflective effect as demonstrated by a substrate reflectance of up to 1% is achievable. In general, the ARC must have a k value of 0.2 or greater in order to reduce reflectance to or below 1% at a coating thickness of 100 nm or less (see FIG. 2). In the trilayer structure wherein the undercoat layer serves to restrain reflection to a certain extent, the intermediate layer may have an optimum k value of less than 0.2.

FIGS. 4 and 5 illustrate changes of reflectance with the varying thickness of the intermediate layer and undercoat layer, when the undercoat layer has a k value of 0.2 and 0.6, respectively. The undercoat layer having a k value of 0.2 assumedly corresponds to the undercoat layer optimized for the bilayer process, and the k value of 0.6 for the undercoat layer is approximate to the k values at 193 nm of novolac and polyhydroxystyrene. The thickness of the undercoat layer varies with the topography of the substrate whereas the thickness of the intermediate layer is kept substantially unchanged so that presumably it can be coated to the predetermined thickness. The undercoat layer with a higher k value (0.6) is effective in reducing reflectance to 1% or less with a thinner film. In the event that the undercoat layer has a k value of 0.2 and a thickness of 250 nm, the intermediate layer must be increased in thickness in order to provide a reflectance of 1% or less. Increasing the thickness of the intermediate layer is not preferable because a greater load is applied to the topcoat resist layer during dry etching of the intermediate layer. To use the undercoat layer in thin film form, it must have not only a high k value, but also greater etching resistance.

In the event the underlying processable film is a low-dielectric-constant insulating film of porous silica, the positive resist suffers from a footing problem and a poisoning problem that scum is left in the spaces. It is believed that these problems arise because ammonia is adsorbed by the porous silica during the substrate cleaning step using ammonia and then liberated during the resist processing step to neutralize the acid generated in the exposed area of resist. JP-A 2004-177666 proposes to use a polymer having acidic groups for prohibiting the poisoning problem.

Naphthalenesulfonic acid novolac resins have excellent functions of surfactant and electrolyte. JP-A 5-17186 and JP-A 2006-233210 disclose use of formaldehyde condensates of naphthalenesulfonic acid as a surfactant to facilitate cement dispersion.

CITATION LIST

Patent Document 1: JP-A H06-118651
Patent Document 2: JP-A H10-324748
Patent Document 3: JP-A H11-302382
Patent Document 4: JP-A 2002-055456
Patent Document 5: JP-A H09-110938
Patent Document 6: JP-A 2002-014474
Patent Document 7: JP-A 2001-040293
Patent Document 8: JP-A 2002-214777
Patent Document 9: U.S. Pat. No. 6,506,497
Patent Document 10: U.S. Pat. No. 6,420,088
Patent Document 11: JP-A 2004-177666
Patent Document 12: JP-A H05-017186
Patent Document 13: JP-A 2006-233210
Non-Patent Document 1: SPIE Vol. 1925 (1993) p 377
Non-Patent Document 2: SPIE Vol. 3333 (1998) p 62
Non-Patent Document 3: J. Photopolymer Sci. and Technol., Vol. 9, No. 3 (1996) p 435-446
Non-Patent Document 4: SPIE Vol. 4345 (2001) p 50
Non-Patent Document 5: J. Vac. Sci. Technol., 16(6), November/December 1979

SUMMARY OF INVENTION

An object of the present invention is to provide an undercoat-forming material useful as an undercoat layer in the bi- or tri-layer resist process, which comprises a novolac resin derived from an aromatic compound having a sulfonic acid or an amine salt thereof, has higher etching resistance than polyhydroxystyrene and cresol novolac resins, and exerts not only a satisfactory antireflective effect, but also a high resistance to poisoning by a porous silica insulating film after substrate cleaning; and a pattern-forming process using the same.

The inventors have found that a novolac resin having an aromatic hydrocarbon group of 6 to 30 carbon atoms substituted with a sulfo group or an amine salt thereof forms a layer displaying high etching resistance and an anti-poisoning effect and is thus promising as an undercoat layer in the bi- or tri-layer resist technology.

The invention provides a material based on a novolac resin derived from an aromatic compound having a sulfonic acid or an amine salt thereof which is useful in forming an undercoat layer in the bi- or tri-layer resist process, and more particularly exhibits improved etching resistance in the lithography using high-energy radiation with wavelength of up to 300 nm, specifically excimer lasers of 248, 193 and 157 nm, soft x-ray (EUV) of 3-20 nm, electron beam (EB) and x-ray. From the material, an undercoat layer exhibiting very high dry etching resistance during substrate processing can be formed.

The undercoat layer according to the invention is mainly applied to the trilayer process. When applied to the KrF or ArF laser bilayer process, the undercoat layer having a relatively high value of k produces more substrate reflection. However, the substrate reflectance can be reduced to or below 1% if the undercoat is combined with an intermediate layer having an antireflective effect.

The undercoat-forming material of the invention can form a film of high denseness which exerts a barrier effect against ammonia gas liberated from a low-dielectric-constant porous silica film by neutralization, preventing the occurrence of poisoning (resist profile anomaly).

In one aspect, the invention provides a photoresist undercoat-forming material comprising a novolac resin having an aromatic hydrocarbon group of 6 to 30 carbon atoms substituted with a sulfo group or an amine salt thereof.

In a preferred embodiment, the novolac resin has the general formula (1).

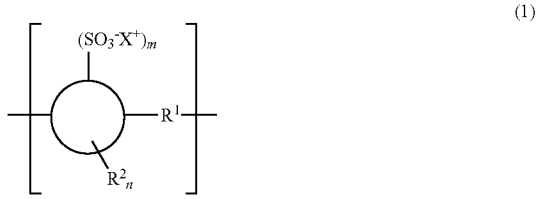

(1)

Herein X is hydrogen, an amine compound having hydrogen added thereto, or quaternary ammonium, $R^1$ is a single bond or a straight or branched $C_1$-$C_6$ alkylene group, the circle stands for an aromatic hydrocarbon group of 6 to 30 carbon atoms, $R^2$ is hydrogen, straight, branched or cyclic $C_1$-$C_{20}$ alkyl, $C_6$-$C_{20}$ aryl, $C_2$-$C_{20}$ alkenyl, straight, branched or cyclic $C_1$-$C_{20}$ alkoxy, amino, or hydroxyl group, m is an integer of 1 to 4, and n is an integer of 0 to 3.

The novolac resin may have a partial structure selected from among naphthalenesulfonic acid, anthracenesulfonic acid, acenaphthenesulfonic acid, fluorenesulfonic acid, phenanthrenesulfonic acid, pyrenesulfonic acid, and ammonium salts of the foregoing acids. The novolac resin may further comprise recurring units in novolac form of one or more compounds selected from among phenol compounds, bisphenol compounds, and bisnaphthol compounds. The novolac resin may further comprise recurring units derived from a compound having a non-conjugated double bond and free of a phenolic hydroxyl group.

The undercoat-forming material may further comprise an organic solvent, and preferably a crosslinker and an acid generator.

In another aspect, the invention provides a pattern forming process comprising the steps of applying the undercoat-forming material defined above onto a processable substrate to form an undercoat layer, applying a photoresist composition onto the undercoat layer to form a photoresist layer, exposing the photoresist layer in a predetermined region to radiation, developing the photoresist layer with a developer to form a photoresist pattern, and processing the undercoat layer and the substrate through the patterned photoresist layer as a mask, by means of a dry etching apparatus.

A pattern forming process is also provided comprising the steps of applying the undercoat-forming material defined above onto a processable substrate to form an undercoat layer, applying a silicon atom-containing intermediate layer over the undercoat layer, applying a photoresist composition onto the intermediate layer to form a photoresist layer, exposing the photoresist layer in a predetermined region to radiation, developing the photoresist layer with a developer to form a photoresist pattern, processing the intermediate layer through the patterned photoresist layer as a mask, removing the patterned photoresist layer, and processing the undercoat layer and then the substrate through the processed intermediate layer as a mask, the processing steps using a dry etching apparatus.

In a preferred embodiment, the photoresist composition comprises a silicon-free polymer, and the step of processing the undercoat layer includes dry etching with an oxygen-based etchant gas. In a preferred embodiment, the processable substrate comprises a low-dielectric-constant film having a dielectric constant of up to 3.5 or a nitride film.

ADVANTAGEOUS EFFECTS OF INVENTION

The photoresist undercoat-forming material of the invention forms an undercoat layer having such an extinction coefficient that it exerts a satisfactory antireflective effect at a thickness of at least 200 nm, optionally when combined with an intermediate layer having an antireflective effect. The material is more robust than conventional m-cresol novolac resins against halide gas etchants, as judged in terms of a rate of etching with $CF_4/CHF_3$ gas or $Cl_2/BCl_3$ gas used for substrate processing, that is, has high etching resistance. The material also has an improved anti-poisoning effect, i.e., resistance to contamination from a porous low-dielectric-constant film having a basic substance adsorbed thereon, ensuring a satisfactory resist profile after patterning.

BRIEF DESCRIPTION OF THE DRAWINGS

FIG. 5 is a graph plotting the substrate reflectance versus varying thickness of the undercoat layer and intermediate layer in trilayer process when the undercoat layer has a fixed n of 1.5 and a fixed k of 0.6, and the intermediate layer has a fixed n of 1.5 and a fixed k of 0.1.

Figure 1:
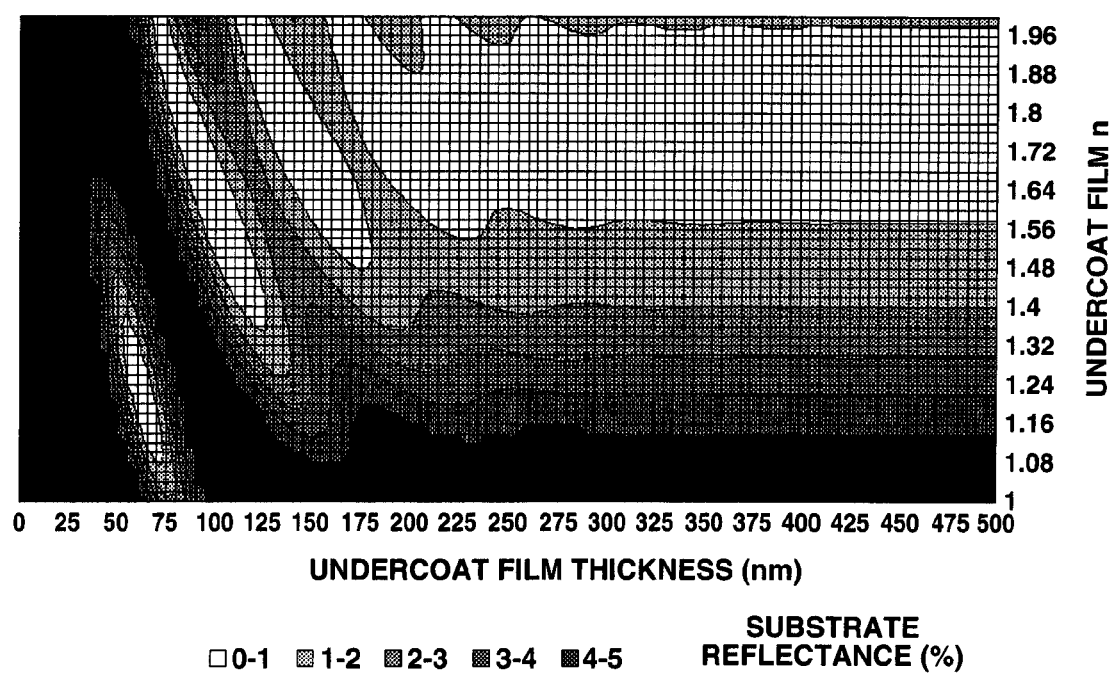
FIG. 1 is a graph plotting the substrate reflectance versus undercoat layer thickness in bilayer process when the k value of the undercoat layer is fixed at 0.3 and the n value varies from 1.0 to 2.0.
Figure 2:
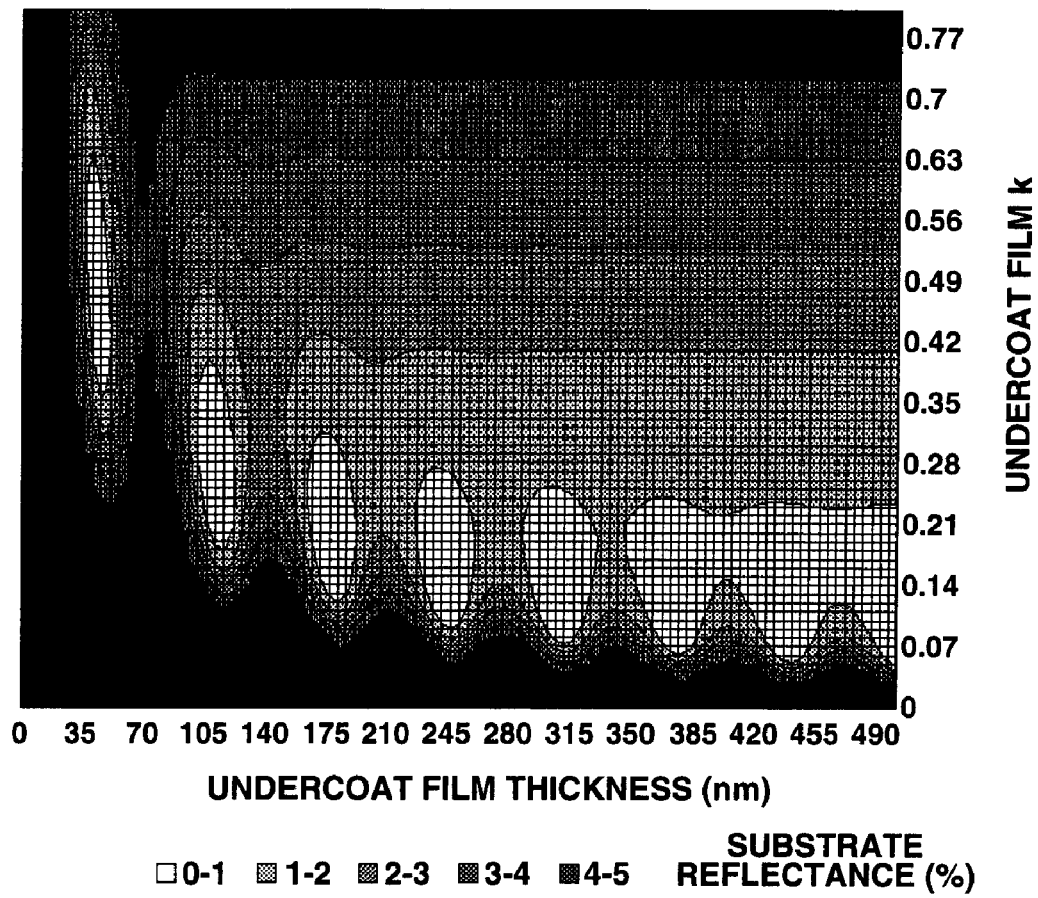
FIG. 2 is a graph plotting the substrate reflectance versus undercoat layer thickness in bilayer process when the n value of the undercoat layer is fixed at 1.5 and the k value varies from 0 to 1.0.
Figure 3:
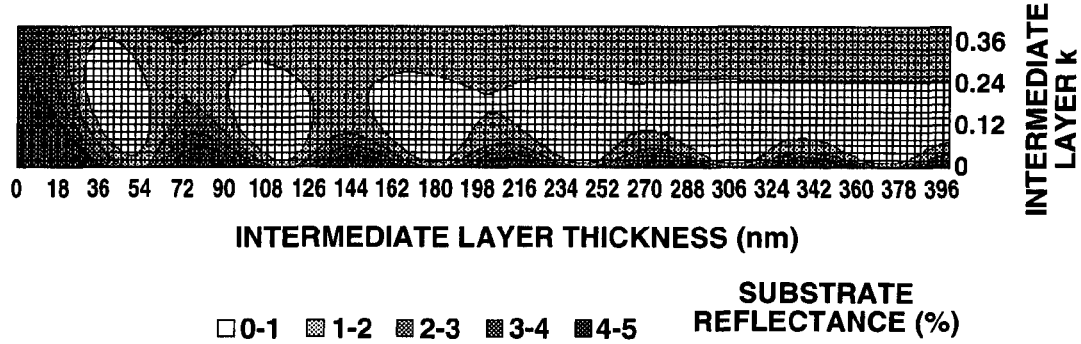
FIG. 3 is a graph plotting the substrate reflectance in trilayer process when the undercoat layer has a fixed n of 1.5, a fixed k of 0.6 and a fixed thickness of 500 nm, and the intermediate layer has a fixed n of 1.5, a k value varying from 0 to 0.4 and a thickness varying from 0 to 400 nm.
Figure 4:
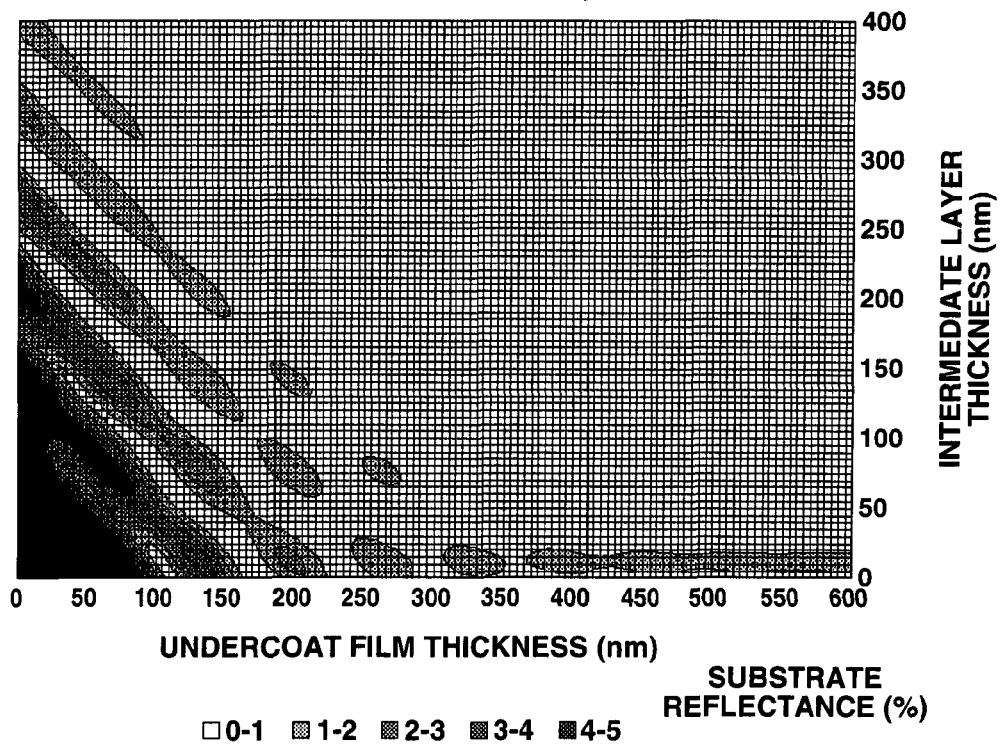
FIG. 4 is a graph plotting the substrate reflectance versus varying thickness of the undercoat layer and intermediate layer in trilayer process when the undercoat layer has a fixed n of 1.5 and a fixed k of 0.2, and the intermediate layer has a fixed n of 1.5 and a fixed k of 0.1.
Figure 6A:
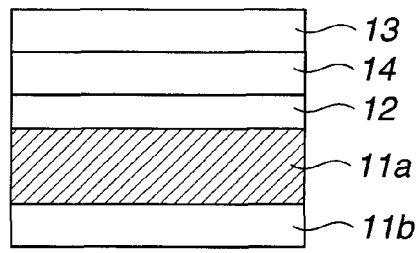
FIG. 6 illustrates steps of a trilayer resist working process.
Figure 6B:
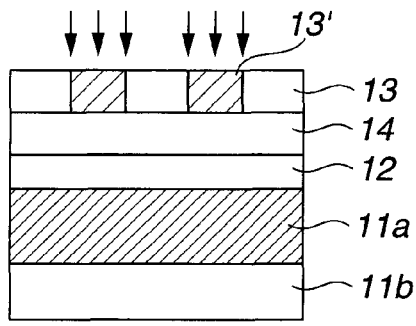
Figure 6C:
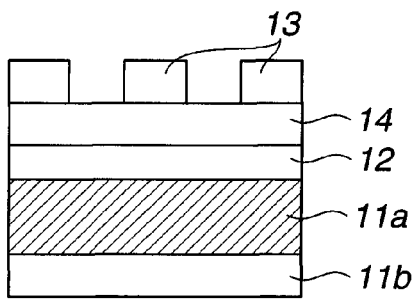
Figure 6D:
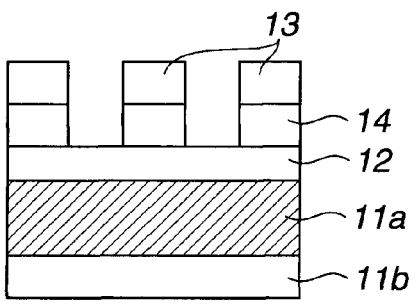
Figure 6E:
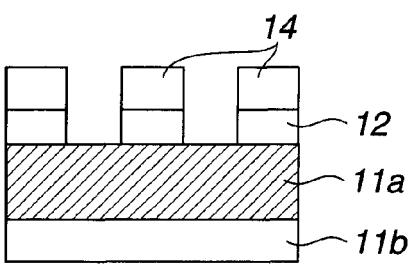
Figure 6F:
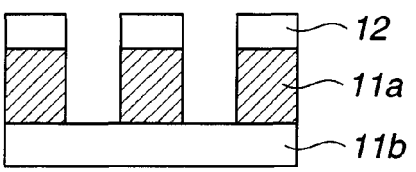

It is noted that the definition of complex index of refraction includes a refractive index (n) and an extinction coefficient (k).

DESCRIPTION OF THE PREFERRED EMBODIMENTS

The singular forms "a", "an" and "the" include plural referents unless the context clearly dictates otherwise. The notation (Cn-Cm) means a group containing from n to m carbon atoms per group.

The patterning process of the invention uses a photoresist undercoat-forming material comprising a novolac resin having an aromatic hydrocarbon group of 6 to 30 carbon atoms substituted with a sulfo group or an amine salt thereof, specifically a novolac resin comprising recurring units of the general formula (1), shown below. The undercoat-forming material is applied onto a substrate to form an undercoat layer. A photoresist composition is applied onto the undercoat layer, optionally via an intermediate layer, to form a photoresist layer. The photoresist layer in a predetermined region is exposed to radiation, and developed with a developer to form a photoresist pattern. Using a dry etching apparatus, the undercoat layer and the substrate are processed through the patterned photoresist layer as a mask.

The undercoat-forming material comprises essentially (A) a novolac resin having an aromatic hydrocarbon group of 6 to 30 carbon atoms substituted with a sulfo group or an amine salt thereof, specifically a novolac resin comprising recurring units of the general formula (1), and optionally and preferably (B) an organic solvent. In addition, (C) a blending polymer, (D) a crosslinker, and (E) an acid generator may be included for the purposes of improving spin coating characteristics, burying of stepped substrates, and film's rigidity and solvent resistance.

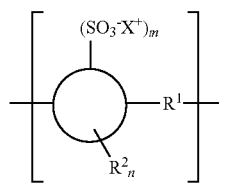

(1)

Herein X is hydrogen, an amine compound having hydrogen added thereto, or quaternary ammonium, $R^1$ is a single bond or a straight or branched $C_1$-$C_6$ alkylene group, the circle stands for an aromatic hydrocarbon group of 6 to 30 carbon atoms, $R^2$ is selected from among hydrogen, straight, branched or cyclic $C_1$-$C_{20}$ alkyl, $C_6$-$C_{20}$ aryl, $C_2$-$C_{20}$ alkenyl, straight, branched or cyclic $C_1$-$C_{20}$ alkoxy, amino, and hydroxyl groups, m is an integer of 1 to 4, and n is an integer of 0 to 3.

In formula (1), X stands for an amine compound having hydrogen added thereto, which encompasses basic compounds to be described later. The circle (○) stands for an aromatic hydrocarbon group of 6 to 30 carbon atoms, examples of which include benzene, naphthalene, anthracene, acenaphthene, fluorene, triphenylene, phenalene, phenanthrene, indene, indane, indacene, pyrene, chrysene, perylene, naphthacene, pentacene, coronene, heptacene, benzo[a]anthracene, dibenzophenanthrene, and dibenzo[a,j] anthracene.

Of groups of $R^2$, suitable $C_1$-$C_{20}$ alkyl groups include methyl, ethyl, n-propyl, isopropyl, n-butyl, t-butyl, cyclopentyl, cyclohexyl, norbornyl, adamantyl, adamantanemethyl, adamantaneethyl, tetracyclodecanyl, and tricyclodecanyl. Suitable $C_1$-$C_{20}$ alkoxy groups include methoxy, ethoxy, n-propoxy, isopropoxy, n-butoxy, t-butoxy, cyclopentyloxy, cyclohexyloxy, norbornyloxy, adamantyloxy, adamantanemethyloxy, adamantaneethyloxy, tetracyclodecanyloxy, and tricyclodecanyloxy. Suitable $C_6$-$C_{20}$ aryl groups include phenyl, naphthyl, anthracenyl, biphenyl, trityl, and pyrenyl. Suitable $C_2$-$C_{20}$ alkenyl groups include vinyl, allyl, propenyl, butenyl, hexenyl, cyclohexenyl, octenyl, benzyl, phenethyl, naphthalenemethyl, anthracenemethyl, pyrenemethyl, and fluorenemethyl.

In the novolac resin, sulfonation of an aromatic hydrocarbon group is an electrophilic substitution reaction to substitute a sulfonic acid group for a hydrogen atom on the aromatic hydrocarbon. This reaction is described in JP-A H05-17186 and JP-A 2006-233210. Sulfonated aromatic hydrocarbon may be obtained by adding 1.1 to 1.5 moles of conc. or fuming sulfuric acid to 1 mole of aromatic hydrocarbon and effecting reaction at 100 to 200° C. for 2 to 10 hours. Then 2 to 10 moles of water for condensation is added, a solution containing 0.7 to 1.0 mole of an aldehyde in a concentration of 20 to 50% is added dropwise at 60 to 150° C. over 4 hours, and reaction is effected at 80 to 150° C. for 10 to 50 hours for novolac formation. It is preferred from the standpoints of etch resistance and optical properties that the aromatic hydrocarbon used herein be a fused hydrocarbon having at least two benzene rings such as naphthalene or polycyclics.

The sulfonated aromatic hydrocarbon alone may be converted into a novolac form in the presence of an aldehyde or copolycondensed with a phenol compound or a compound having a non-conjugated double bond and free of a phenolic hydroxyl group. Novolac resins derived from the sulfonated aromatic hydrocarbon are fully water soluble, but some are less soluble in ordinary solvents such as propylene glycol monomethyl ether acetate (PGMEA). For increased solubility in PGMEA, copolycondensation with a phenol compound is effective.

Examples of copolymerizable phenol compounds and compounds having a non-conjugated double bond and free of a phenolic hydroxyl group include phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 4-cyclopentylphenol, 4-cyclohexylphenol, 4-norbornylphenol, 4-(1-adamantylphenol), 4-(2-adamantylphenol), 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, isothymol, 1-naphthol, 2-naphthol, 2-methyl-1-naphthol, 4-methoxy-1-naphthol, 7-methoxy-2-naphthol, dihydroxynaphthalenes such as 1,5-dihydroxynaphthalene, 1,7-dihydroxynaphthalene and 2,6-dihydroxynaphthalene, and methyl 3-hydroxy-naphthalene-2-carboxylate, as well as indene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, 5-vinylnorborn-2-ene, α-pinene, β-pinene, and limonene.

It is also possible to copolycondensate the sulfonated aromatic hydrocarbon with an aromatic compound having a methanol group resulting from addition of aldehyde to the aromatic group, or an alkoxymethyl or acyloxymethyl group in which the hydrogen atom of alcohol is substituted by an alkyl or acyl group. As long as the aromatic compound has more than one methanol, alkoxymethyl or acyloxymethyl group per molecule, it may be copolycondensed with a sulfobearing aromatic compound of formula (1) to form a polymer comprising desired recurring units.

Examples of the aromatic compound having a methanol group resulting from addition of aldehyde to the aromatic group, include benzylalcohol, benzene-1,2-dimethanol, benzene-1,3-dimethanol, benzene-1,4-dimethanol, benzene-1,2,3-trimethanol, benzene-1,2,4-trimethanol, benzene-1,3,5-trimethanol, benzene-1,4,6-trimethanol, diphenylmethanol, diphenyl-1,6-dimethanol, diphenyl-3,4-dimethanol, diphenyl-3,8-dimethanol, naphthalene-1,2-dimethanol, naphthalene-1,3-dimethanol, naphthalene-1,4-dimethanol, naphthalene-1,5-dimethanol, naphthalene-1,6-dimethanol, naphthalene-1,7-dimethanol, naphthalene-1,8-dimethanol, naphthalene-2,3-dimethanol, naphthalene-2,4-dimethanol, naphthalene-2,5-dimethanol, naphthalene-2,6-dimethanol, naphthalene-2,7-dimethanol, naphthalene-2,8-dimethanol, anthracenedimethanol, pyrenedimethanol, fluorene-2,8-dimethanol, fluorene-3,7-dimethanol, indenedimethanol, acenaphthylenedimethanol, phenanthrenedimethanol, naphthacenedimethanol, and pentacenedimethanol. Suitable aromatic compounds having an alkoxymethyl group include substituted forms of the foregoing aromatic compounds having a methanol group in which the hydroxyl group is substituted by $C_1$-$C_6$ alkyl. Suitable aromatic compounds having an acyloxymethyl group include substituted forms of the foregoing aromatic compounds having a methanol group in which the hydroxyl group is substituted by $C_1$-$C_6$ acyl.

It is also possible to copolymerize a bisphenol compound or bisnaphthol compound having the general formula (2) or (3).

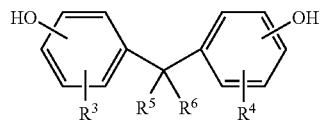

(2)

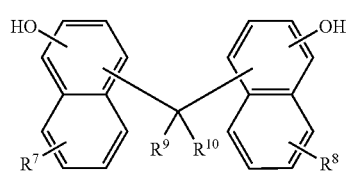

(3)

Herein $R^3$, $R^4$, $R^7$, and $R^8$ are each independently hydrogen, a straight, branched or cyclic $C_1$-$C_{20}$ alkyl group, $C_6$-$C_{20}$ aryl group or $C_2$-$C_{20}$ alkenyl group. $R^5$, $R^6$, $R^9$, and $R^{10}$ are each independently hydrogen, a straight, branched or cyclic $C_1$-$C_{20}$ alkyl group, straight, branched or cyclic $C_2$-$C_{20}$ alkenyl group, or $C_6$-$C_{20}$ aryl group, or $R^5$ and $R^6$, or $R^9$ and $R^{10}$ may bond together to form a ring with the carbon atom to which they are attached. When $R^5$ and $R^6$, or $R^9$ and $R^{10}$ bond together to form a ring, the ring including the carbon atom to which $R^5$ and $R^6$, or $R^9$ and $R^{10}$ are attached has 5 to 30 carbon atoms, especially 6 to 28 carbon atoms.

Examples of the bisphenol compound of formula (2) are given below.

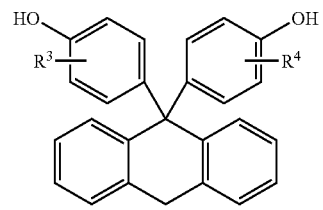

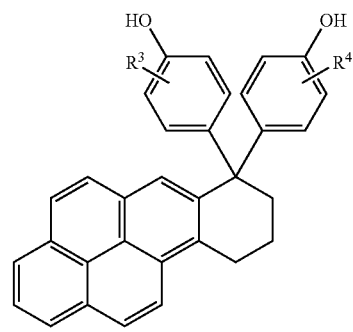

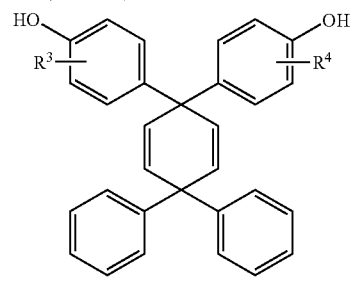

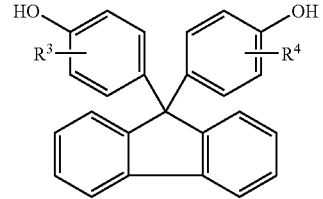

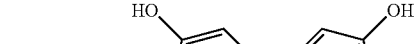

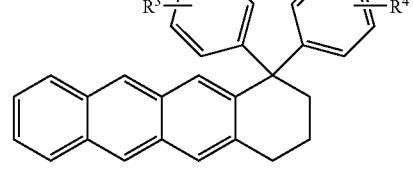

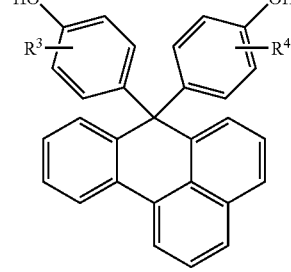

-continued
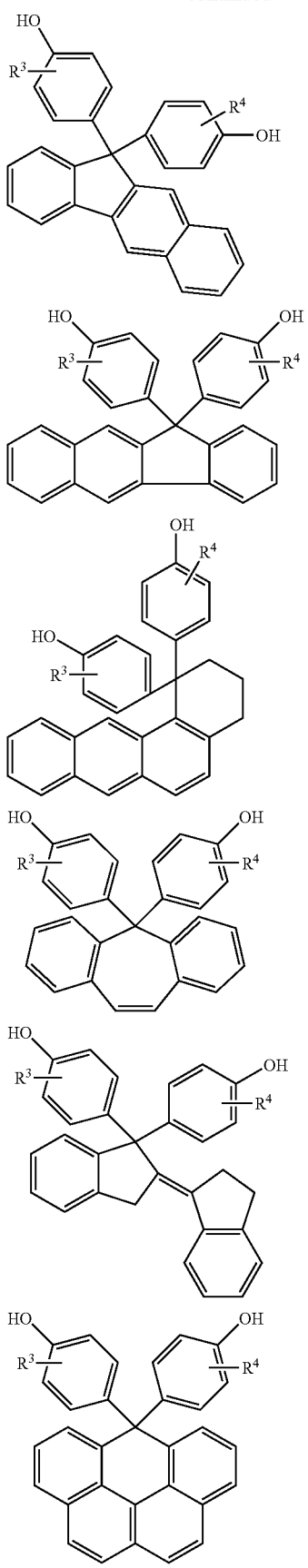
-continued
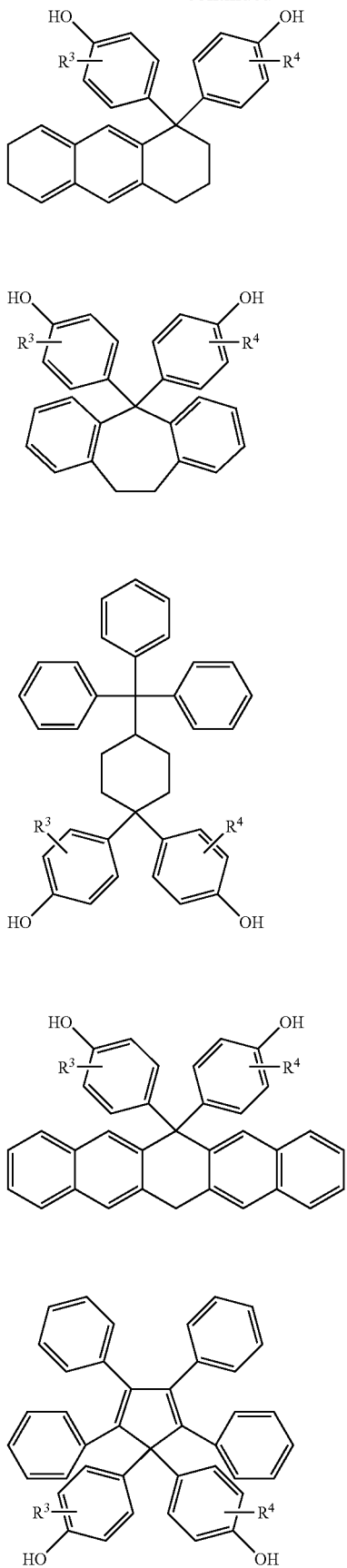

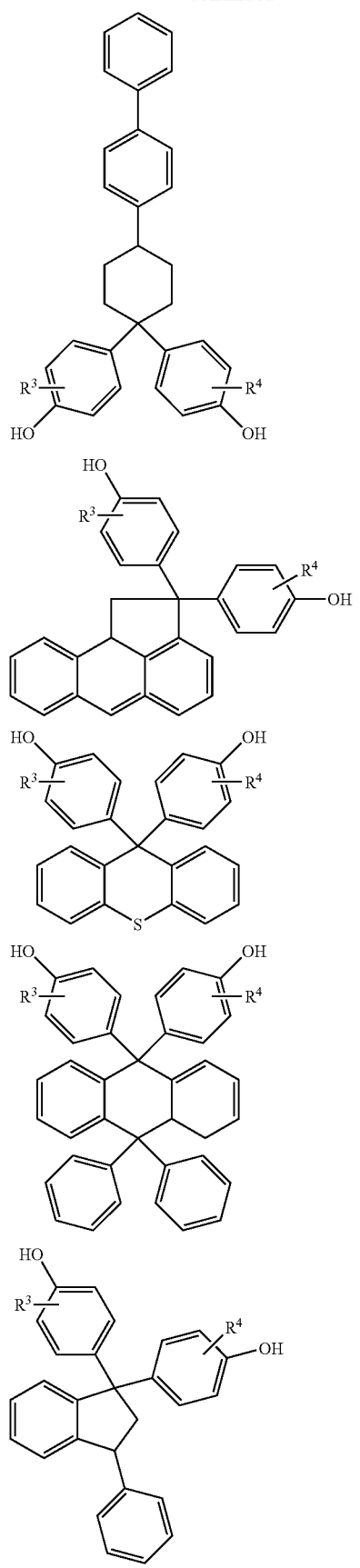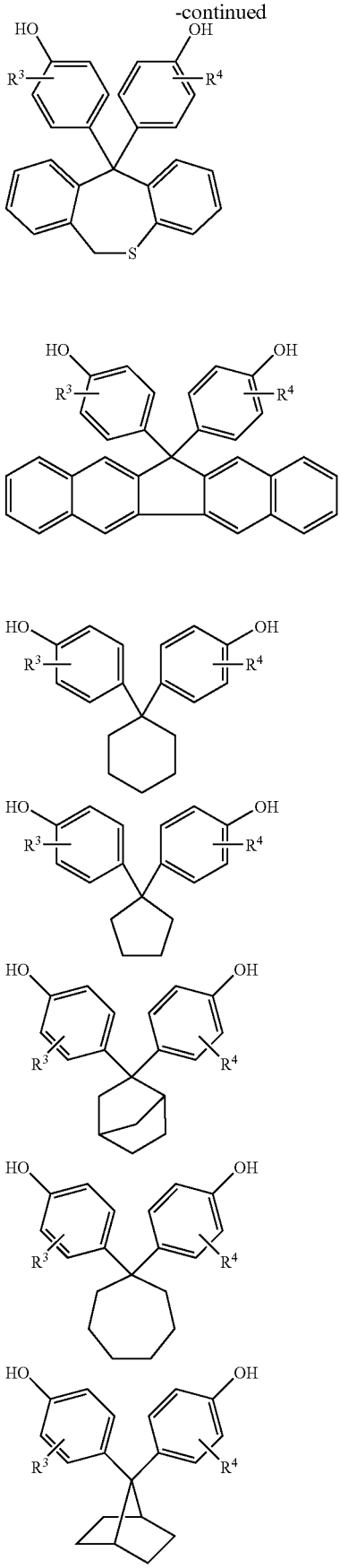

-continued
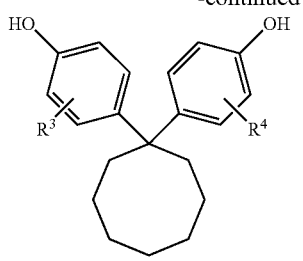
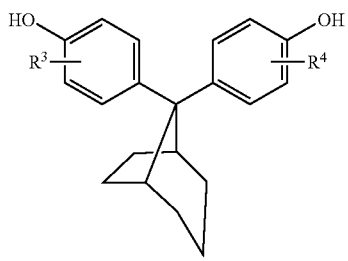
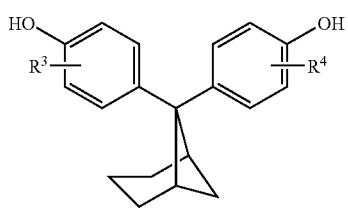
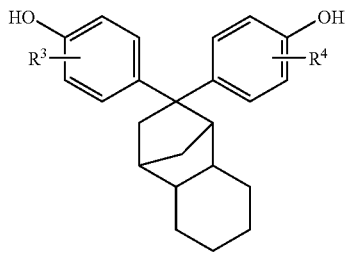
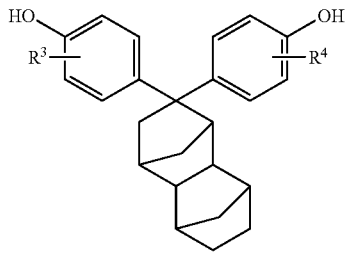
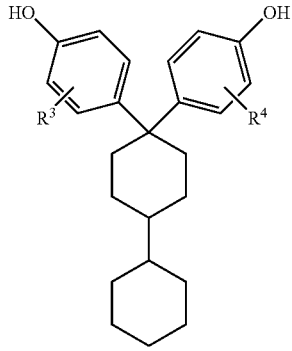
-continued
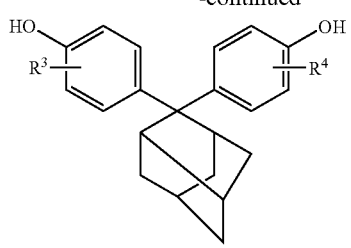
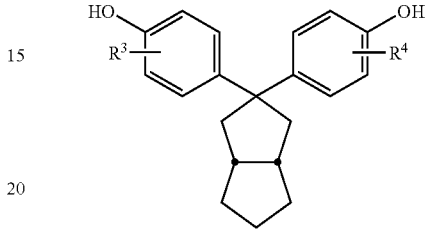
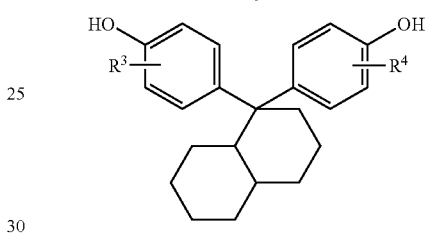
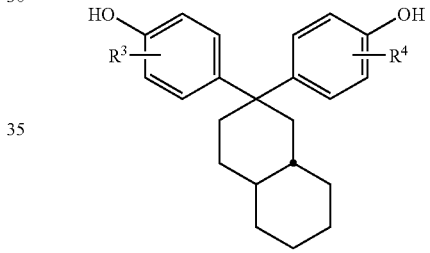
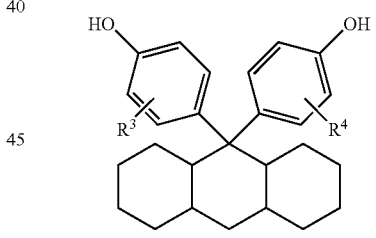
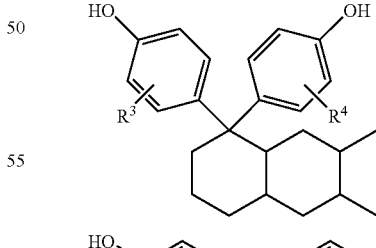
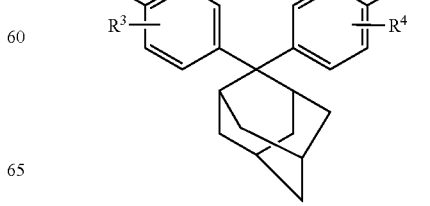

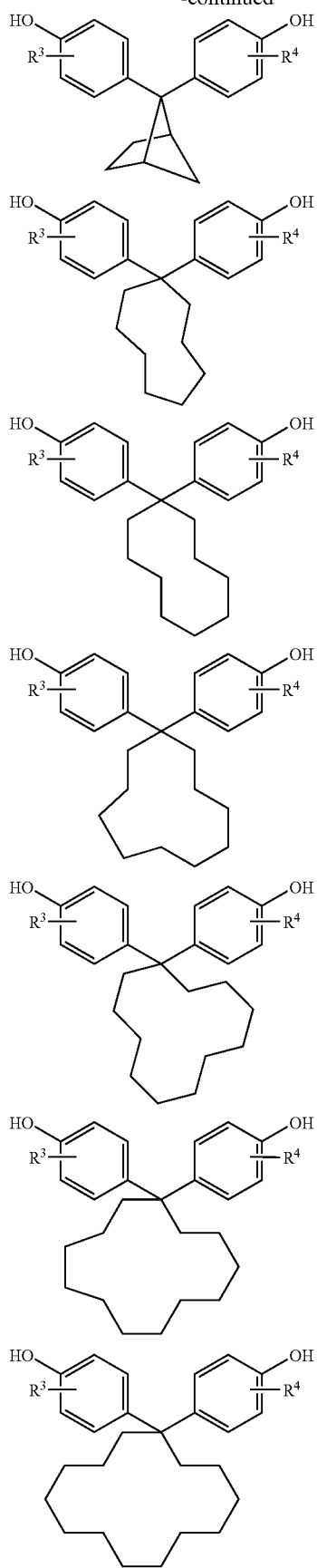
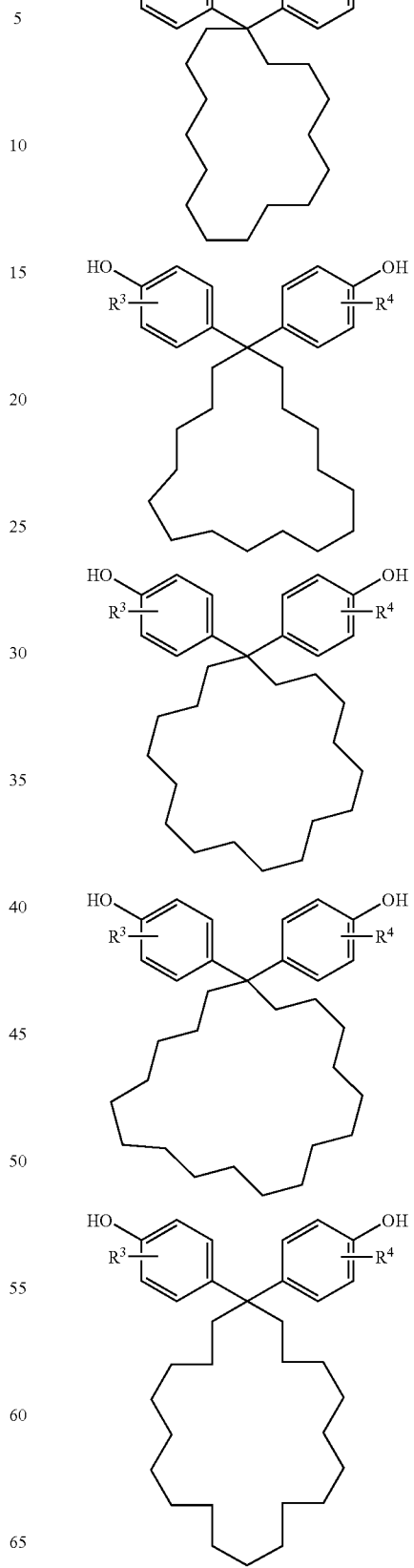

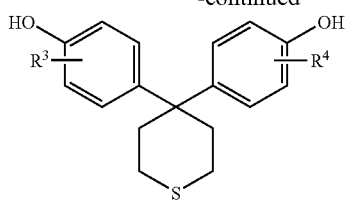
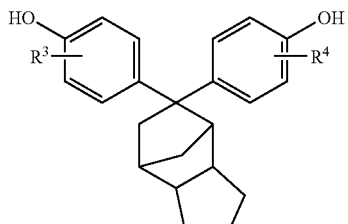
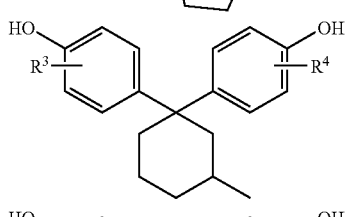
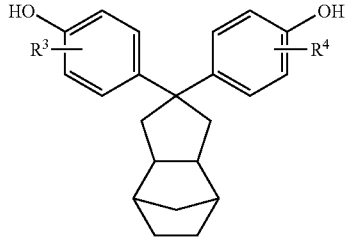
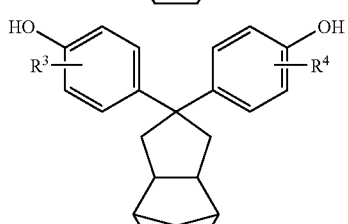
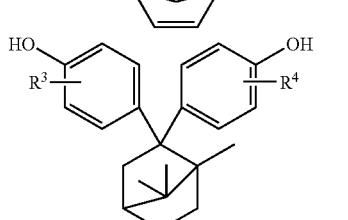
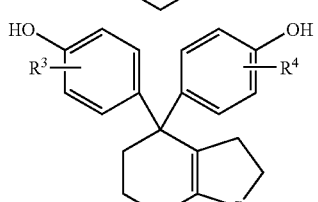
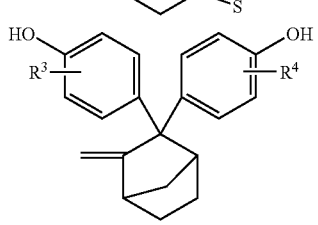
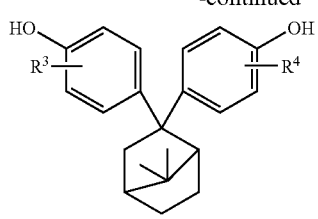
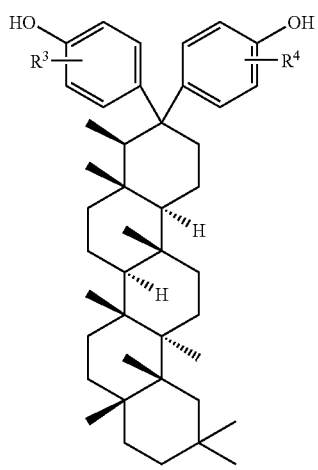
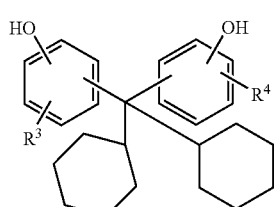
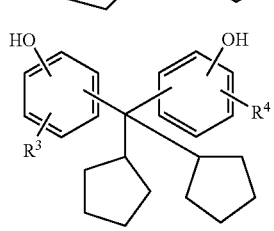
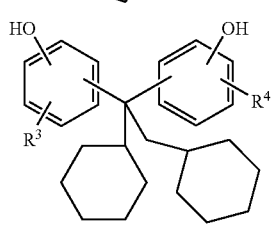
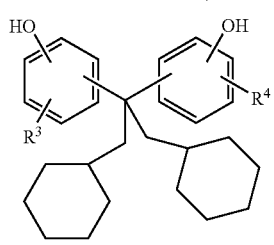

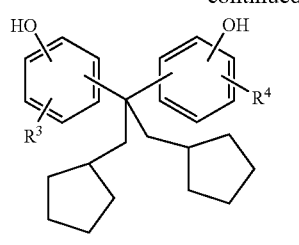
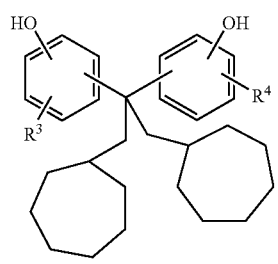
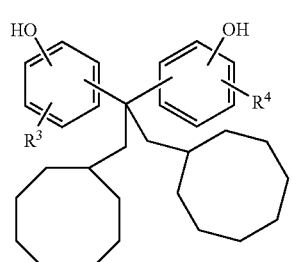
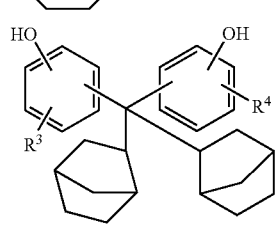
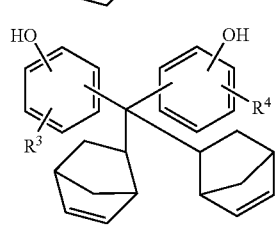
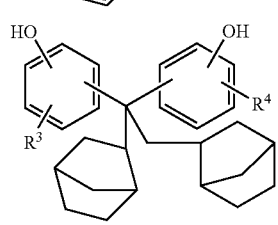
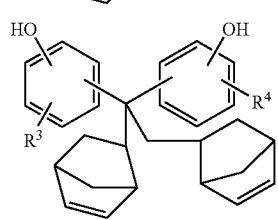
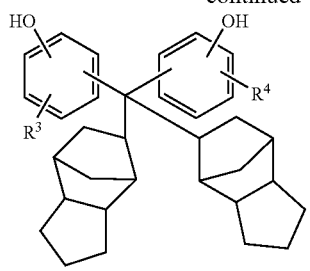
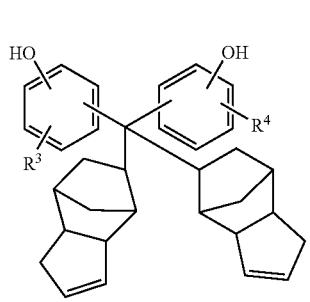
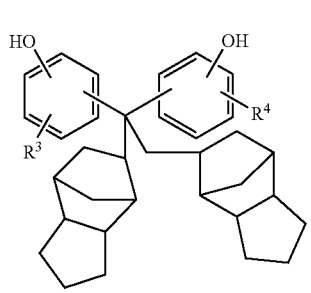
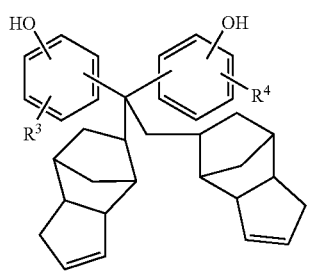
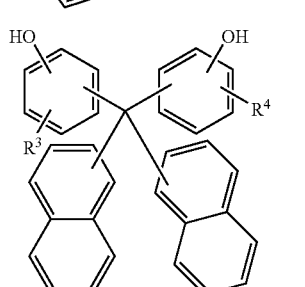
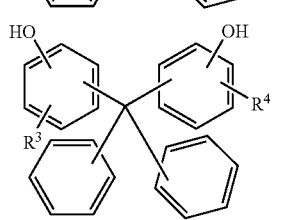

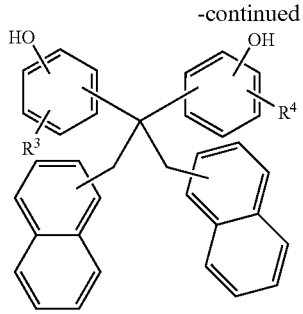
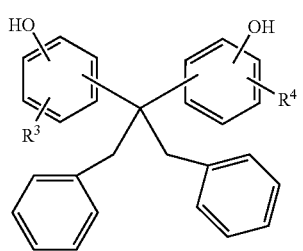
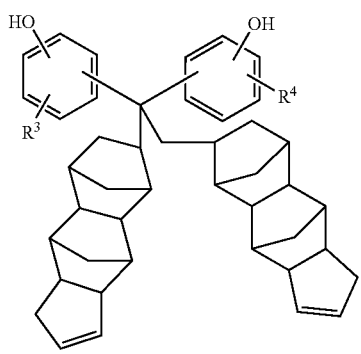
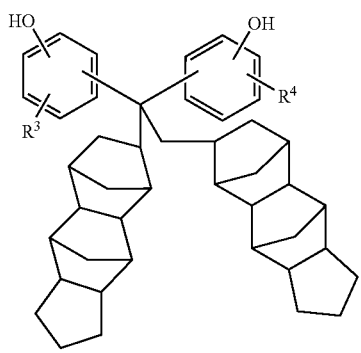
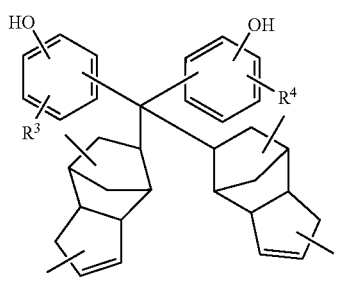
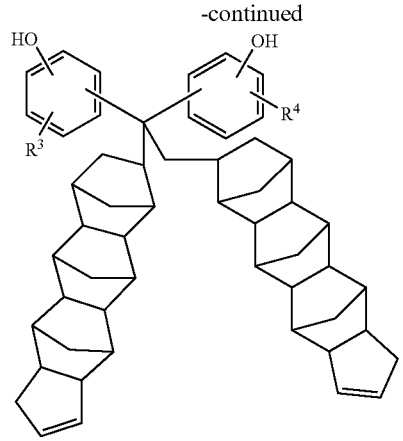
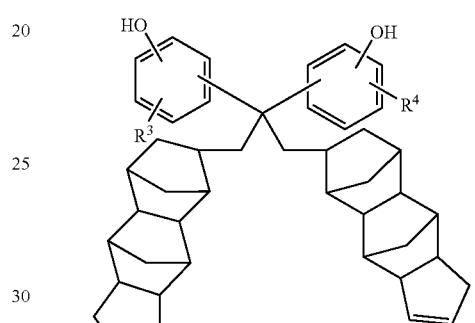
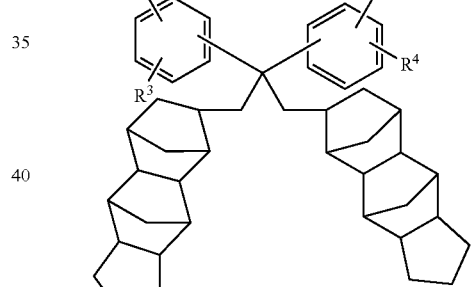
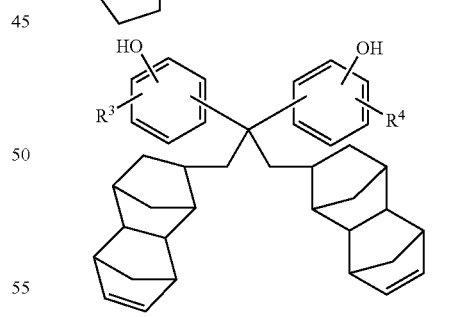
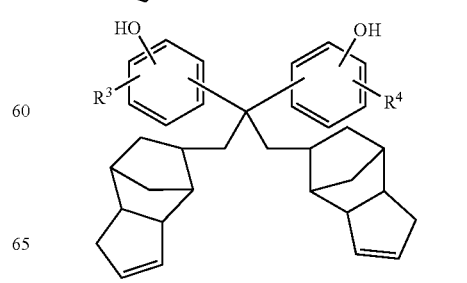

-continued
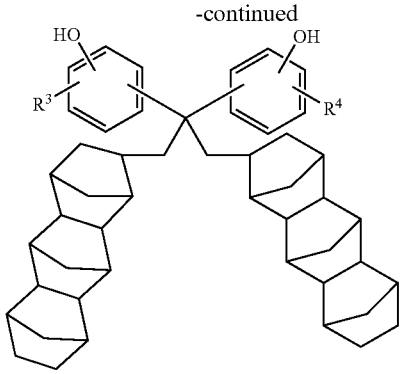
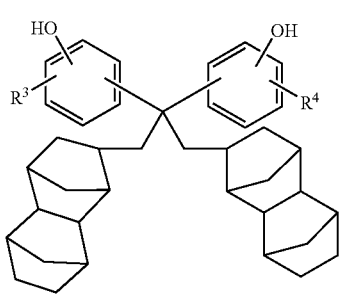
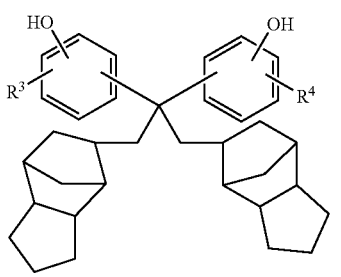
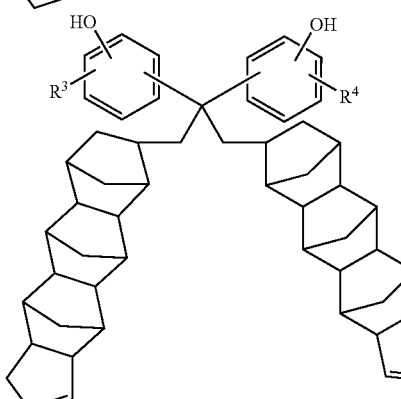
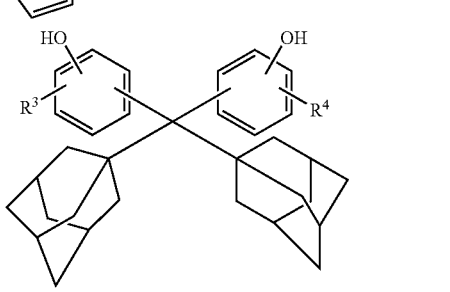
-continued
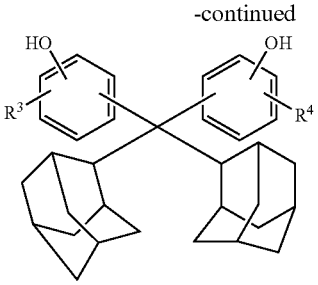
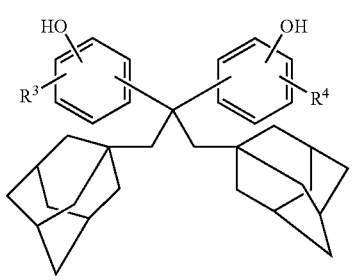
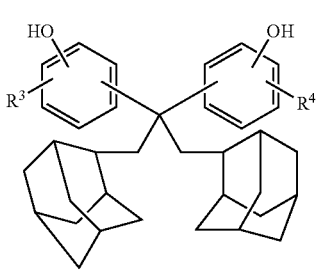
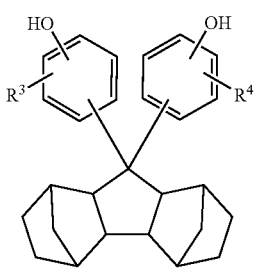
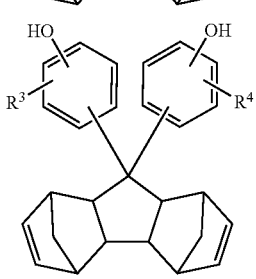
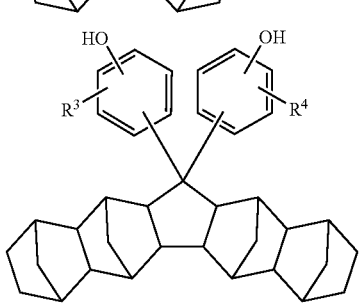

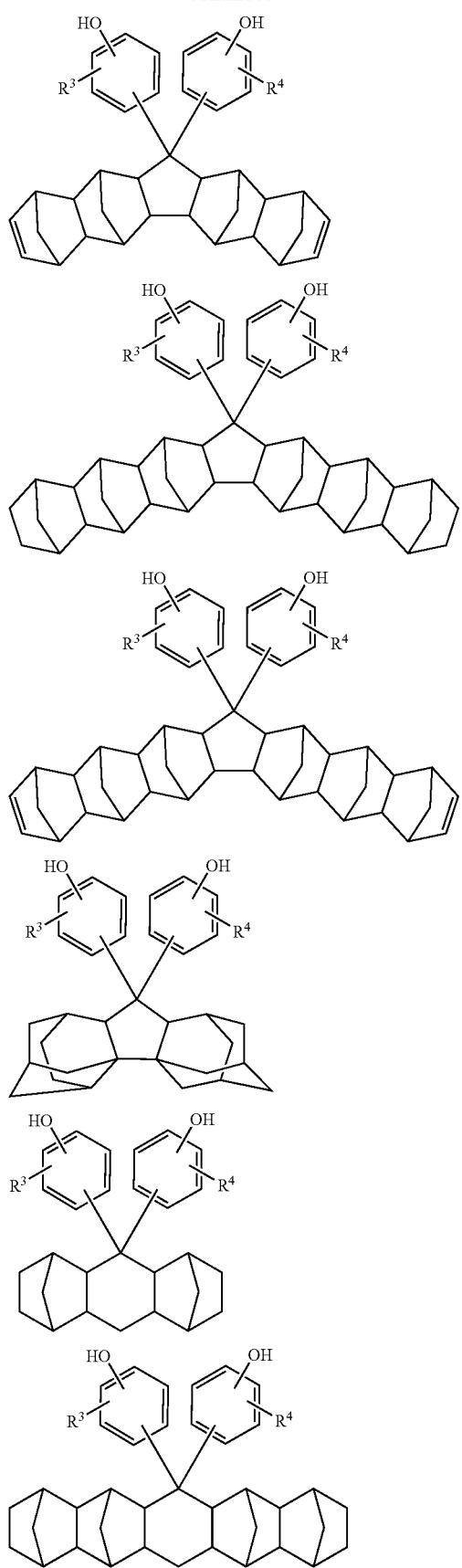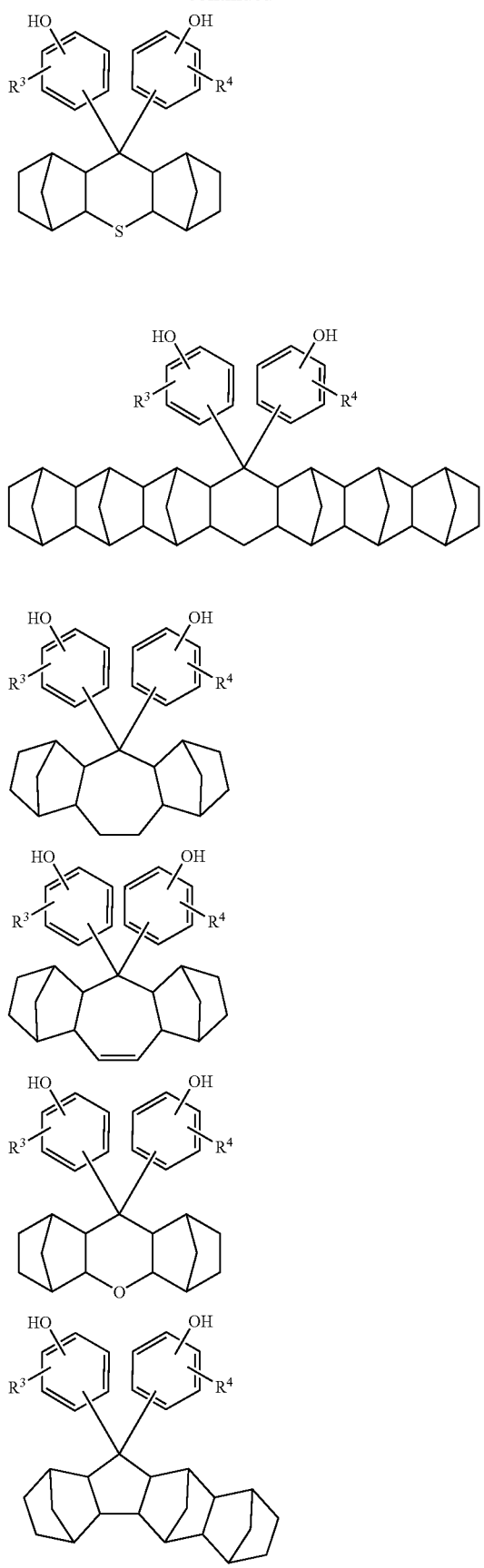

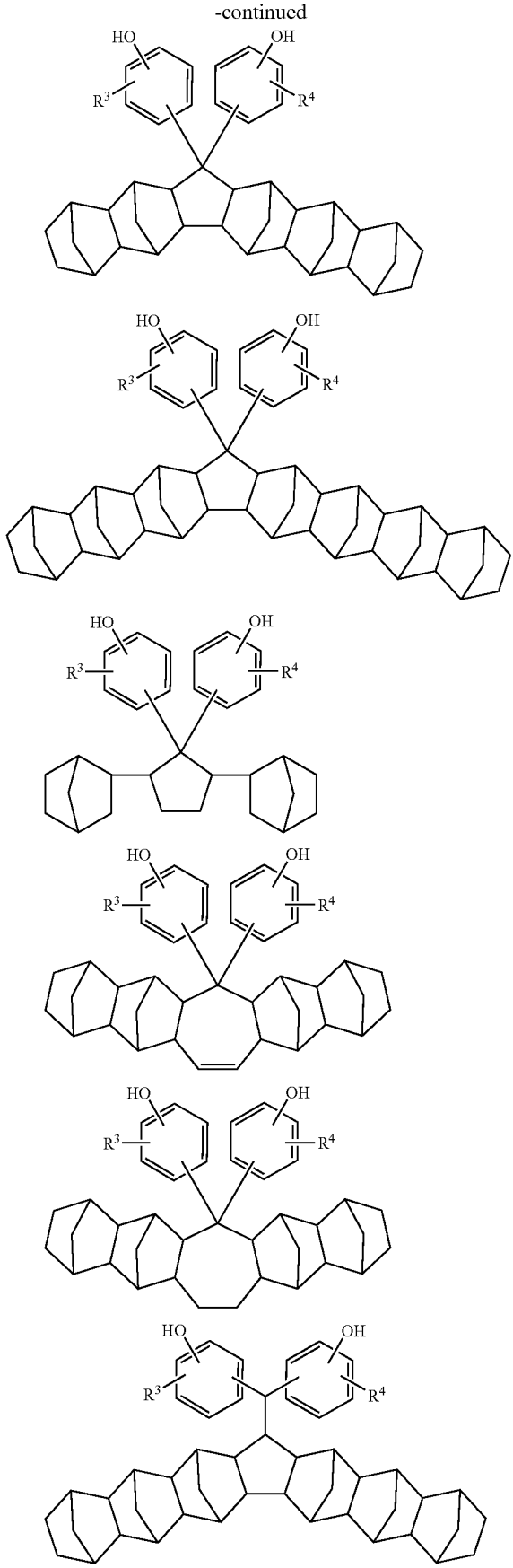
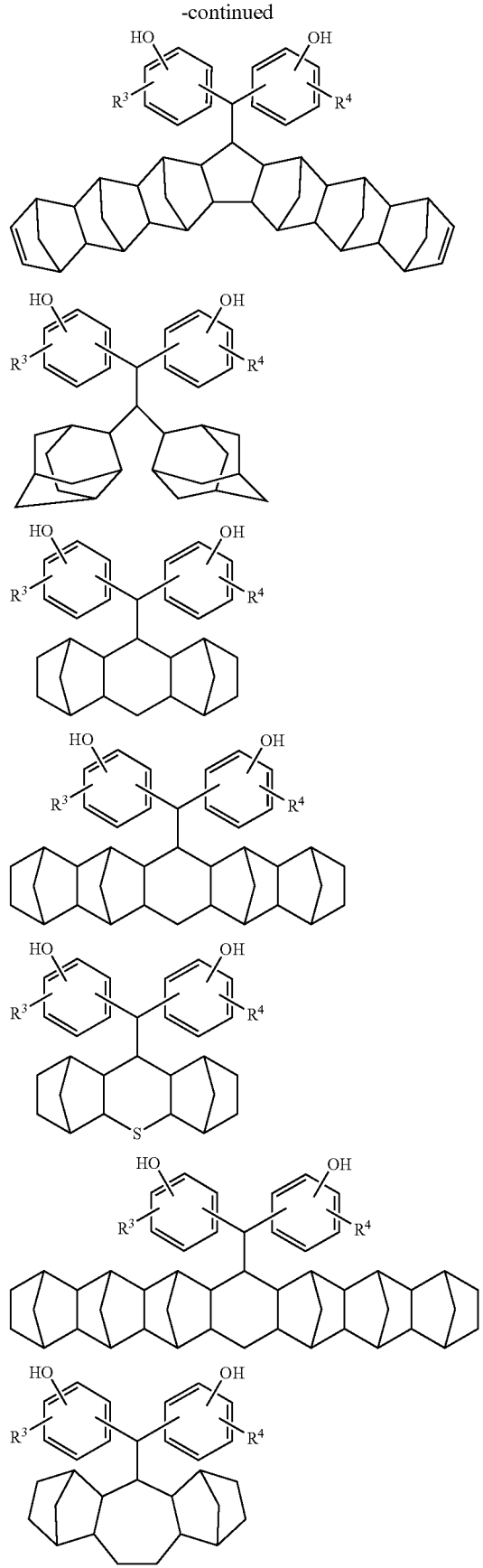

-continued
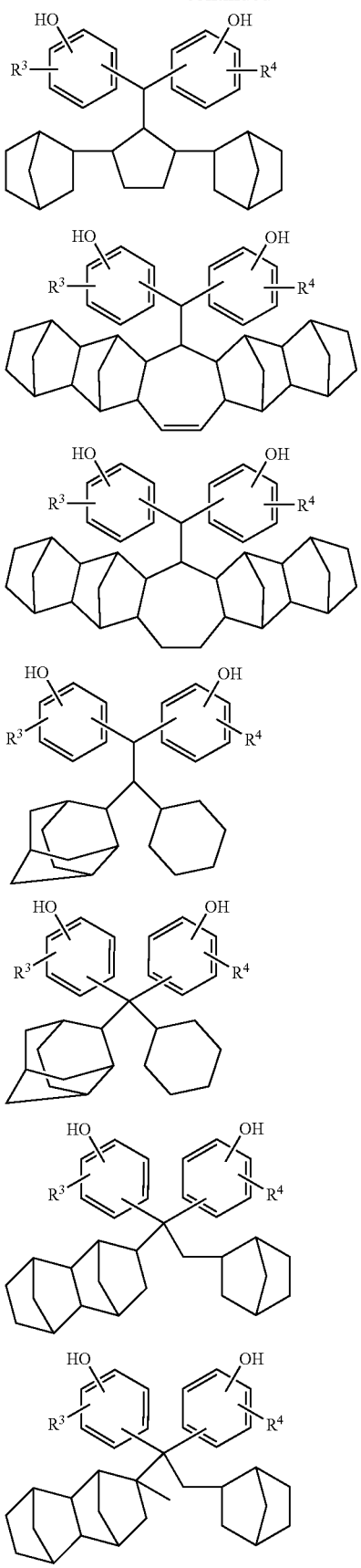
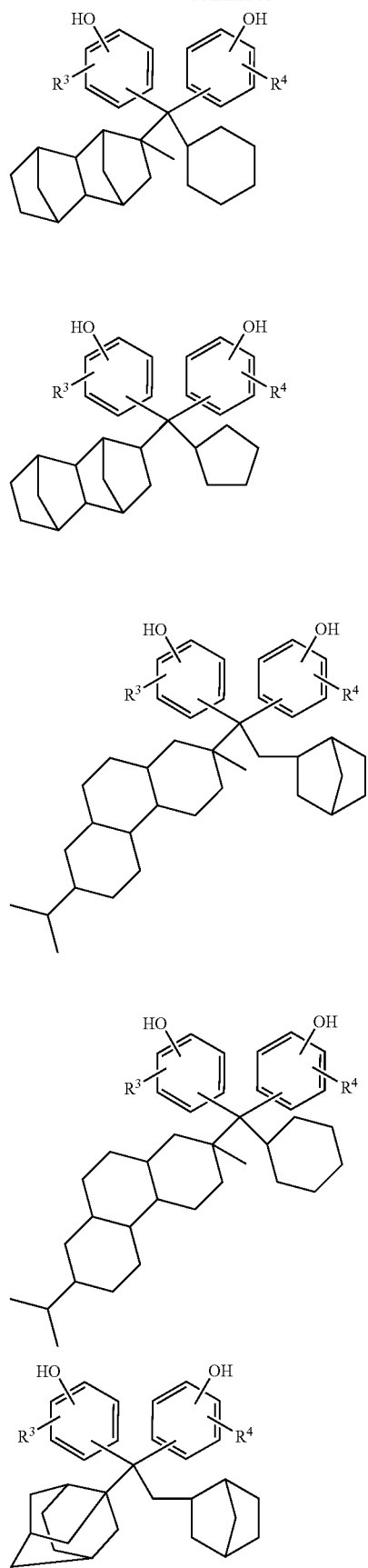

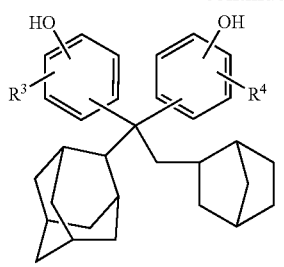
Herein R³ and R⁴ are as defined above.
Examples of the bisnaphthol compound of formula (3) are given below.
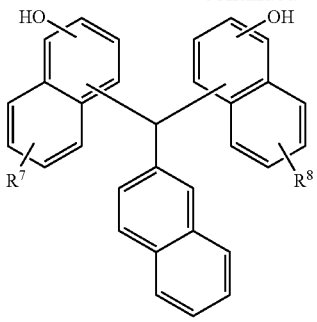
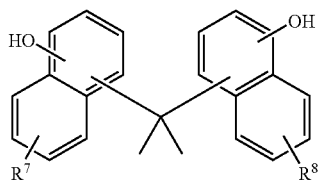
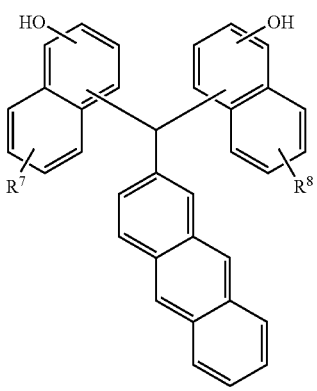
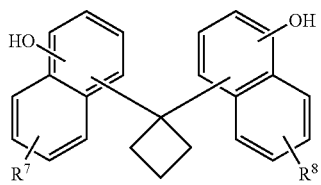
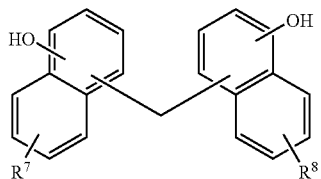
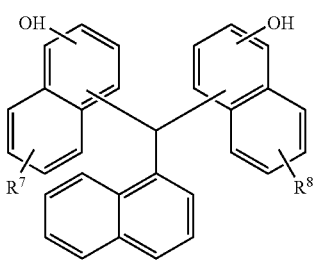
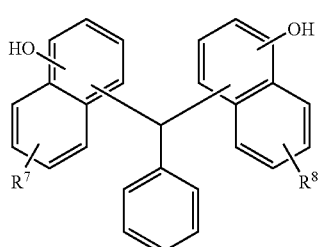
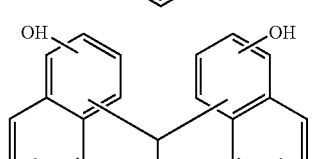
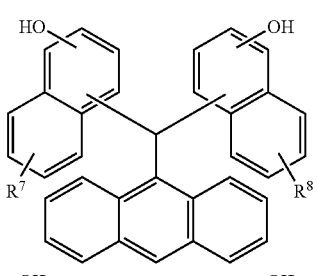
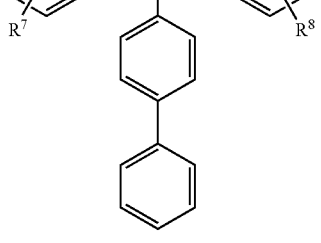
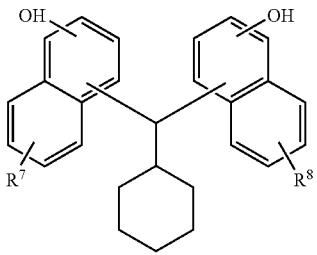

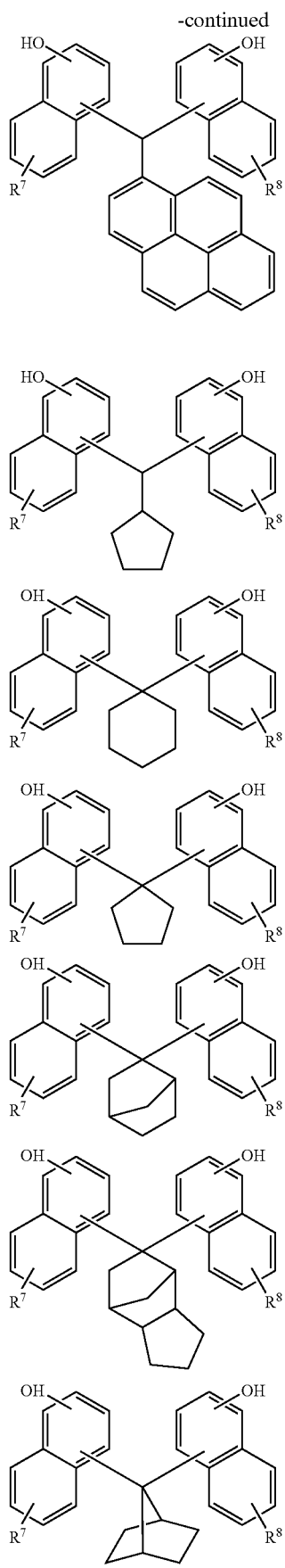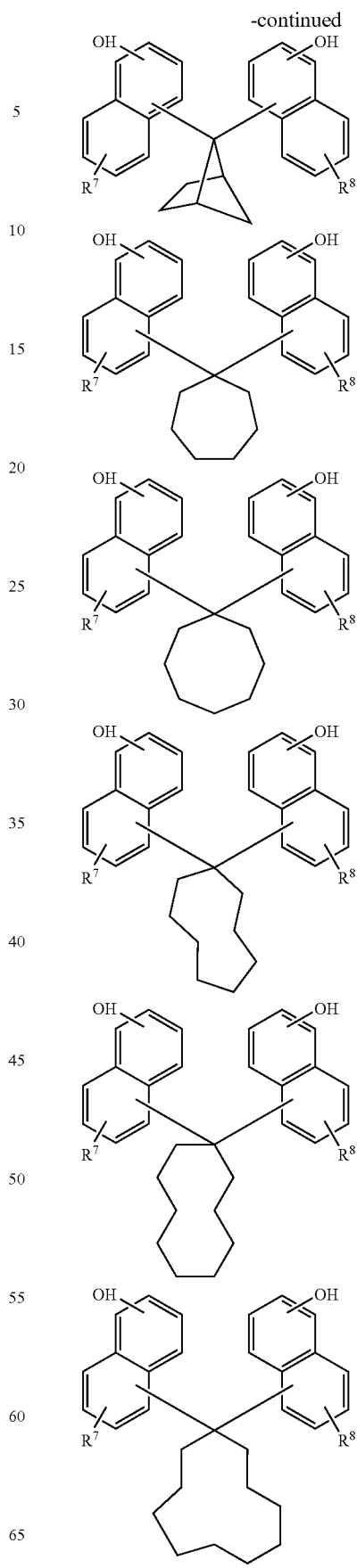

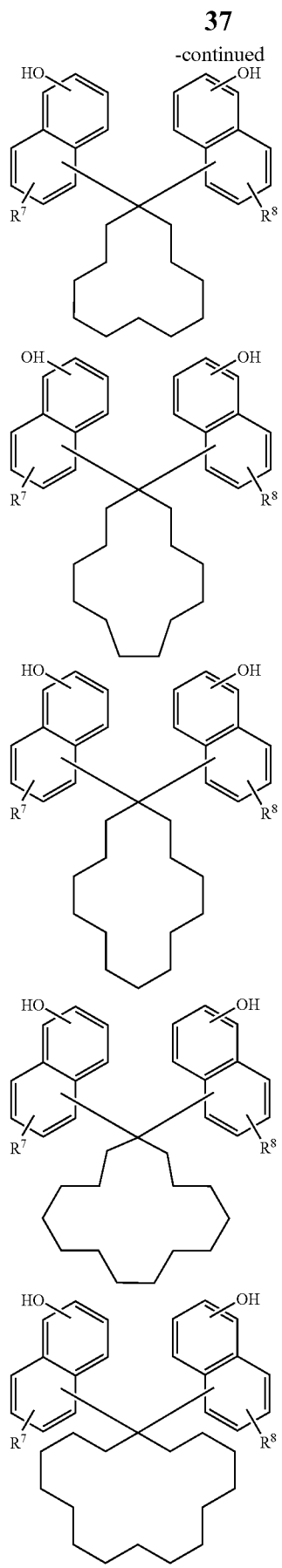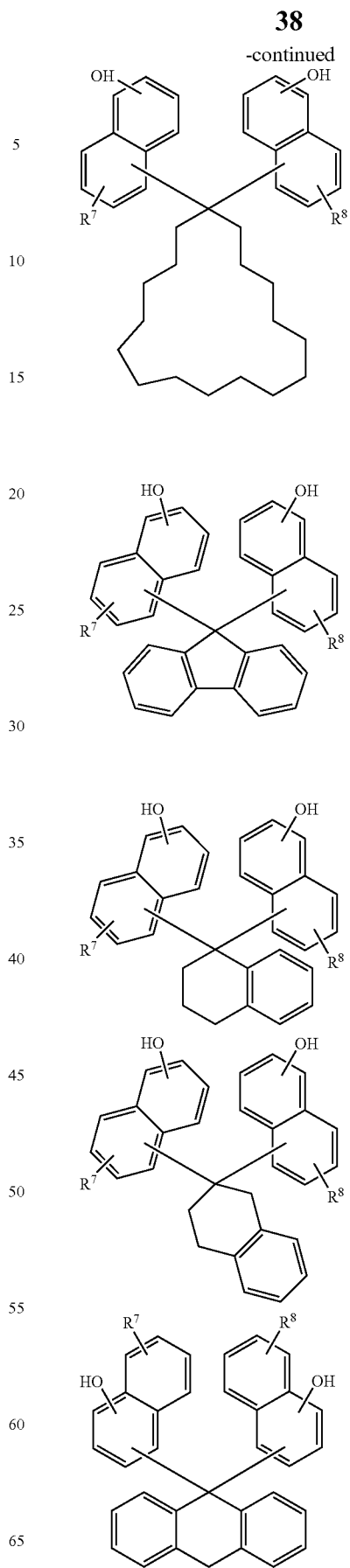

39
-continued
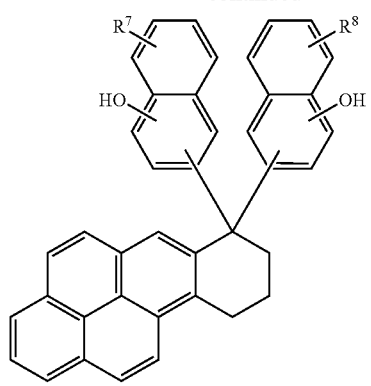
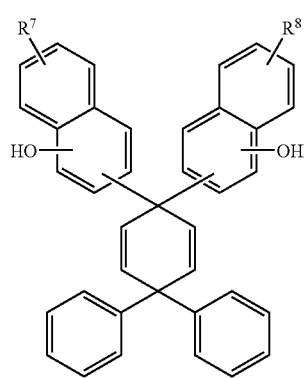
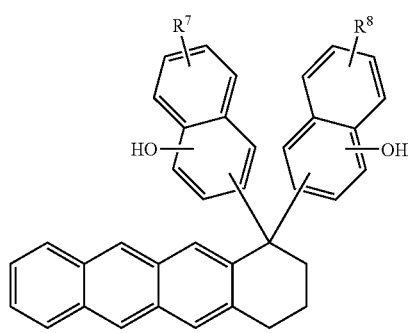
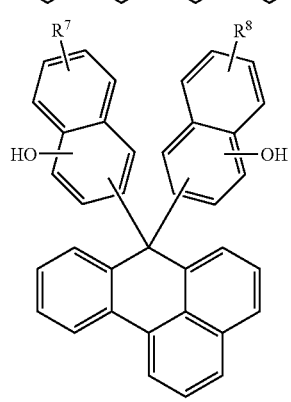
40
-continued
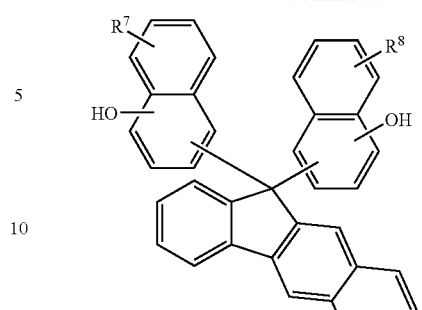
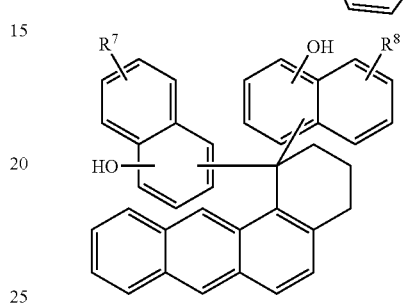
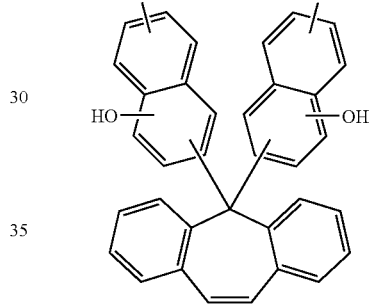
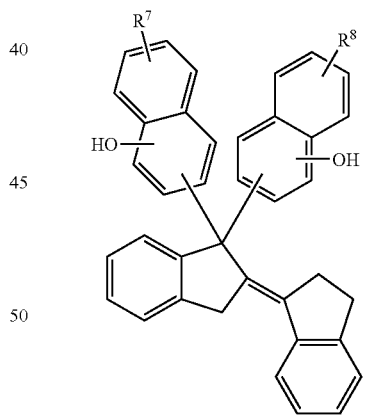
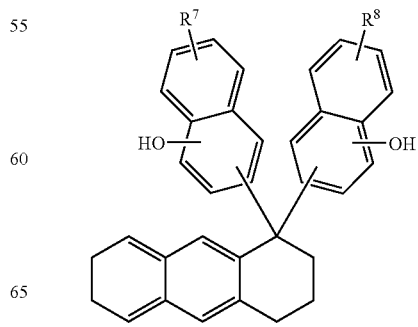

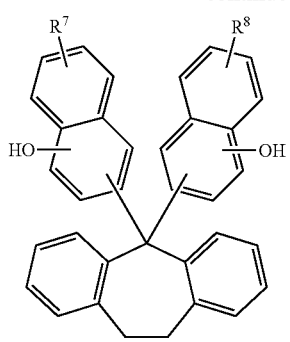
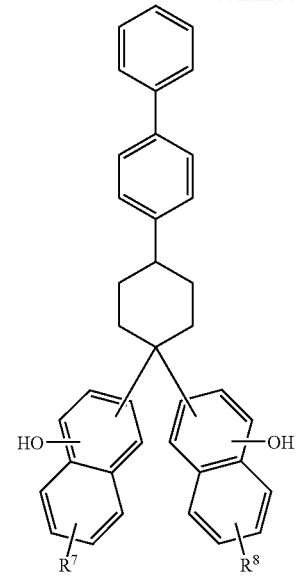
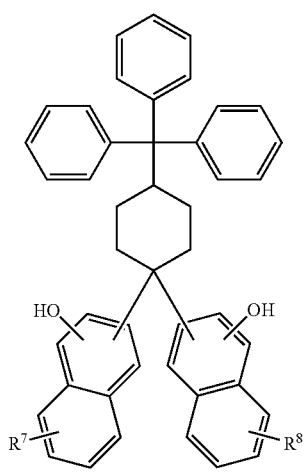
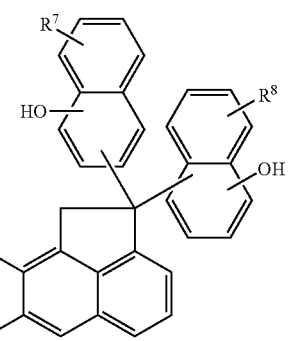
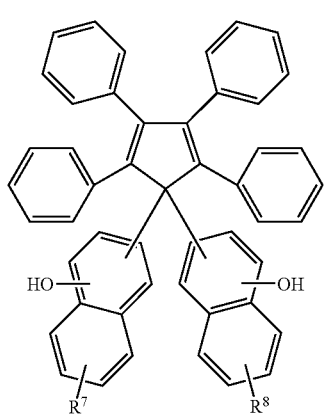
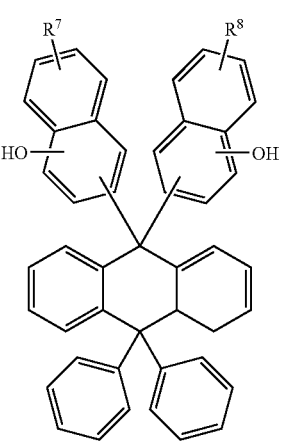

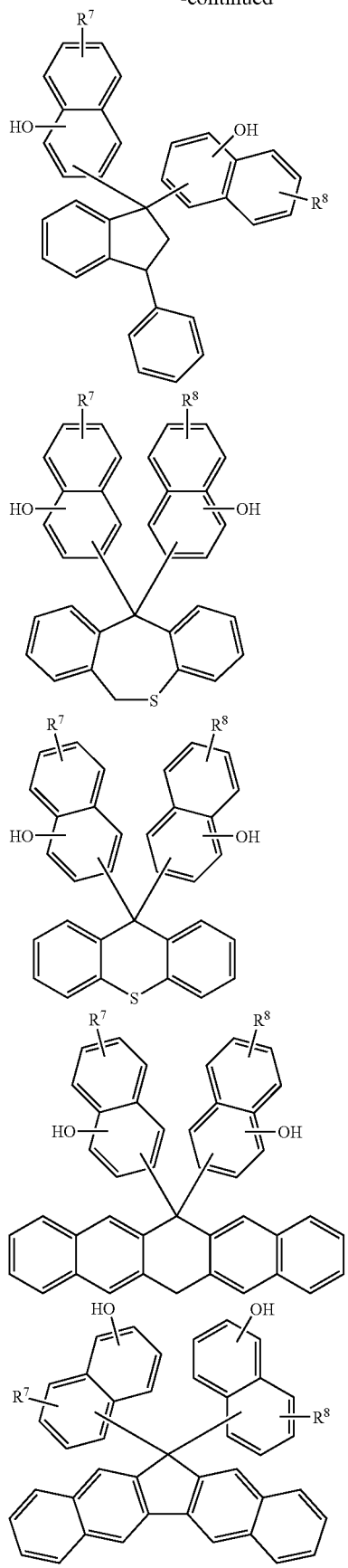
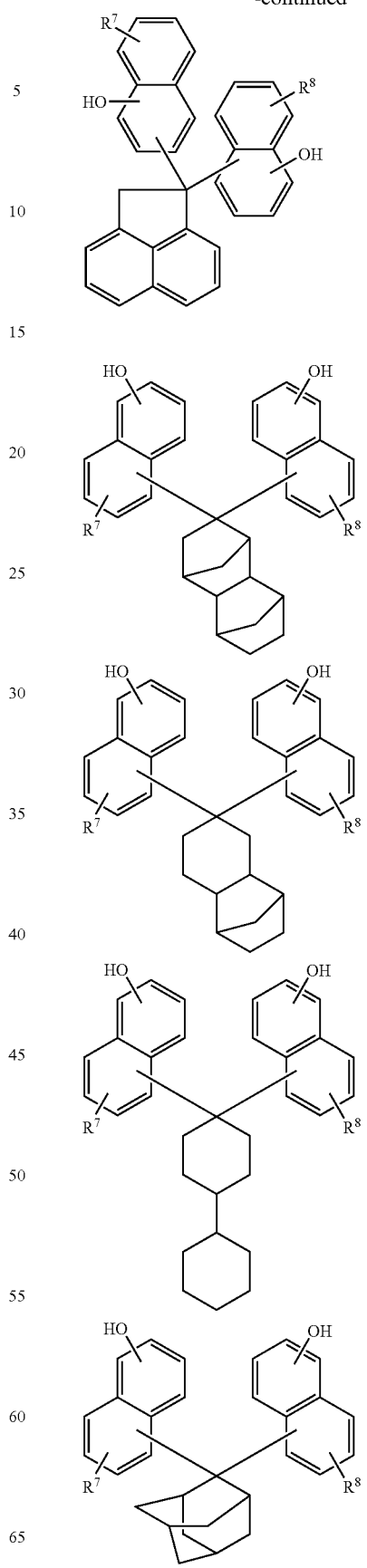

45
-continued
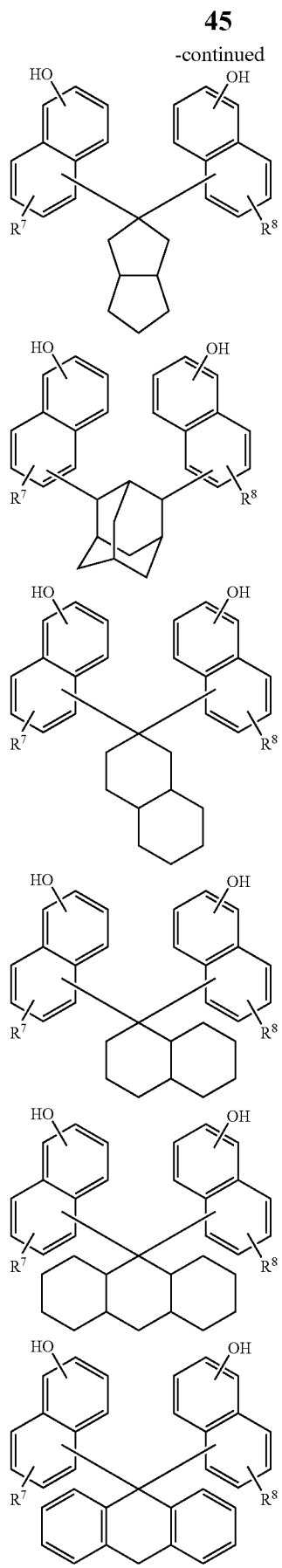
46
-continued
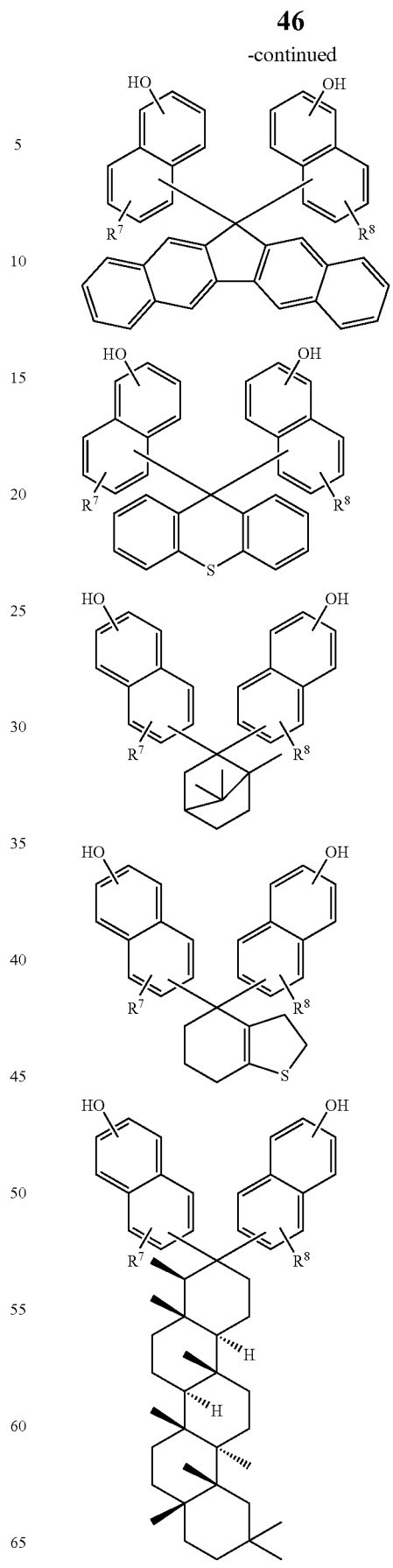

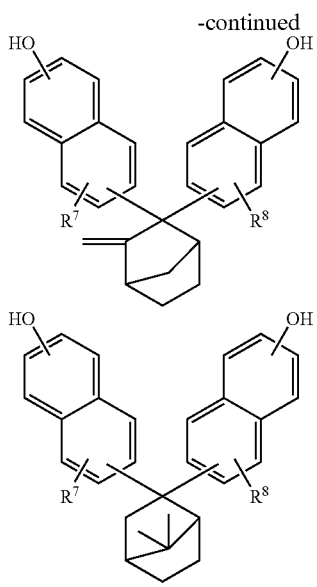

Herein R[7] and R[8] are as defined above.

The compounds of formulae (2) and (3) may be obtained by reacting a phenol or naphthol with a corresponding ketone compound in a standard way.

The aromatic hydrocarbon having a sulfo group may be subjected to condensation reaction with an aldehyde to form a novolac resin comprising recurring units, typically of formula (1). The resulting novolac resin is ready for use as the undercoat layer according to the invention.

Examples of the aldehyde which can be used herein include formaldehyde, trioxan, paraformaldehyde, benzaldehyde, acetaldehyde, propylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, and furfural. Inter alia, formaldehyde is most preferred. The aldehydes may be used alone or in admixture of two or more. An appropriate amount of the aldehyde used is 0.2 to 5 moles, more preferably 0.5 to 2 moles per mole of the sulfo-bearing aromatic hydrocarbon.

A catalyst may be used in the condensation reaction of the sulfo-bearing aromatic hydrocarbon with aldehyde. Suitable catalysts are acidic catalysts including hydrochloric acid, nitric acid, sulfuric acid, formic acid, oxalic acid, acetic acid, methanesulfonic acid, camphorsulfonic acid, tosylic acid, and trifluoromethanesulfonic acid. An appropriate amount of the acidic catalyst used is $1\times10^{-5}$ to $5\times10^{-1}$ mole per mole of the sulfo-bearing aromatic hydrocarbon.

It is noted that the aldehyde is not necessarily needed in the case of copolymerization reaction with a compound having a non-conjugated double bond such as indene, hydroxyindene, benzofuran, hydroxyanthracene, acenaphthylene, biphenyl, bisphenol, trisphenol, dicyclopentadiene, tricyclopentadiene, tetracyclopentadiene, tetrahydroindene, 4-vinylcyclohexene, norbornadiene, 5-vinylnorborn-2-ene, α-pinene, β-pinene, and limonene.

A solvent may be used as the reaction medium in the polycondensation. The solvent is typically selected from water, methanol, ethanol, propanol, butanol, tetrahydrofuran, dioxane, and mixtures thereof. The solvent is preferably used in an amount of 0 to 2,000 parts by weight per 100 parts by weight of the reactants.

The reaction temperature may be selected as appropriate depending on the reactivity of reactants although it is usually in the range of 10 to 200° C.

The condensation reaction may be conducted by charging the phenol, aldehyde, and catalyst all at once or by adding dropwise the phenol and aldehyde in the presence of the catalyst.

After the completion of polycondensation reaction, the reactor is heated to a temperature of 130 to 230° C. for removing the unreacted monomers and catalyst in the system. The volatiles may be removed at such temperature under a vacuum of about 1 to 50 mmHg.

The sulfo-bearing phenol compounds from which recurring units of formula (1) are derived may be polymerized alone or copolymerized with other phenol monomers.

The novolac resin thus produced should preferably contain 1 to 100 mol %, more preferably 5 to 100 mol % of recurring units A of formula (1). The content of recurring units B derived from the copolymerizable phenol monomer is preferably 0 to 98 mol %, more preferably 0 to 95 mol %, and the content of recurring units C derived from the copolymerizable other monomer free of a phenolic hydroxyl group is preferably 0 to 90 mol %, more preferably 0 to 80 mol %.

Inclusion of recurring units B is preferred. In one embodiment wherein the novolac resin comprises recurring units A, recurring units B, and optionally recurring units C, an appropriate proportion of each unit is:
recurring units A: 1 mol %≦A≦100 mol %,
  more preferably 2 mol %≦A≦100 mol %,
recurring units B: 0 mol %≦B≦98 mol %,
  more preferably 0 mol %≦B≦95 mol %, and
recurring units C: 0 mol %≦C≦90 mol %,
  more preferably 0 mol %≦C≦80 mol %.
In the embodiment wherein recurring units C are included, the proportion thereof is preferably at least 5 mol %, more preferably at least 10 mol %, while the proportion of recurring units B may be 0 mol %.

The novolac resin should preferably have a weight average molecular weight (Mw) of 1,000 to 30,000, more preferably 2,000 to 20,000, as measured by gel permeation chromatography (GPC) versus polystyrene standards. Its molecular weight distribution or dispersity (Mw/Mn) is preferably in the range of 1.2 to 7. A narrow dispersity which is arrived at by cutting off monomeric and oligomeric components or a low-molecular-weight fraction having a Mw of not more than 1,000 offers benefits of more efficient crosslinking and reduced amounts of volatile components during baking, preventing contamination around the baking cup.

The inventive novolac resin comprising recurring units of formula (1) can be hydrogenated to improve its transparency at 193 nm. The degree of hydrogenation is preferably up to 80 mol %, more preferably up to 60 mol % of the aromatic groups. Although the lower limit is 0 mol %, the degree of hydrogenation is preferably at least 5 mol % when hydrogenation is conducted.

Further, the novolac resin comprising recurring units of formula (1) can be blended with another polymer. Preferred for this blending purpose are polymers which can serve the functions of improving film formation by spin coating and burying in stepped substrates when blended with the novolac resin comprising recurring units of formula (1). More preferably a choice may be made of materials having a high carbon density and etching resistance. Suitable blending polymers include novolac resins derived from phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, isothymol, 4,4'-(9H-fluoren-9-ylidene)bisphenol, 2,2'-dimethyl-4,4'-(9H-fluoren-9-ylidene)bisphenol, 2,2'-diallyl-4,4'-(9H-fluoren-9-ylidene)bisphenol, 2,2'-difluoro-4,4'-(9H-fluoren-9-ylidene)bisphenol, 2,2'-diphenyl-4,4'-(9H-fluoren-9-ylidene)bisphenol, 2,2'-dimethoxy-4,4'-(9H-fluoren-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, 1-naphthol, 2-naphthol, 2-methyl-1-naphthol, 4-methoxy-1-naphthol, 7-methoxy-2-naphthol, and dihydroxynaphthalenes such as 1,5-dihydroxynaphthalene, 1,7-dihydroxynaphthalene and 2,6-dihydroxynaphthalene, methyl 3-hydroxy-naphthalene-2-carboxylate, indene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, 5-vinylnorborn-2-ene, α-pinene, β-pinene, limonene, etc.; and polyhydroxystyrene, polystyrene, polyvinyl naphthalene, polyvinyl anthracene, polyvinyl carbazole, polyindene, polyacenaphthylene, polynorbornene, polycyclodecene, polytetracyclododecene, polynortricyclene, poly(meth)acrylate, and copolymers thereof.

The amount of the blending polymer compounded is usually 0 to 1,000 parts by weight, preferably 0 to 500 parts by weight per 100 parts by weight of the novolac resin comprising recurring units of formula (1).

One of the functions required for the undercoat layer including an antireflective film is the elimination of intermixing with the overcoat layer (i.e., silicon-containing intermediate layer and resist layer) and the elimination of diffusion of low molecular weight components into the overcoat layer (see Proc. SPIE Vol. 2195 (1994) p 225-229). One common means for preventing intermixing and diffusion is by baking an antireflective film as spin coated for inducing thermal crosslinkage. Then, in the event the antireflective film material contains a crosslinker, a method of introducing crosslinkable substituent groups into the polymer may be employed. Even when a particular crosslinker is not added, the novolac resin comprising recurring units of formula (1) undergoes crosslinkage through condensation reaction of hydroxyl groups induced by heating at a temperature of 300° C. or higher or condensation of aromatic hydrocarbon by the catalysis of sulfonic acid. Particularly when condensation of aromatic hydrocarbon takes place, an amorphous carbon-like film forms which has a higher carbon density and extremely high etch resistance.

Examples of the crosslinker which can be used herein are described in US 2008038662A1 (JP-A 2008-65303, paragraphs [0075] to [0080]). The crosslinker is preferably compounded in an amount of 1 to 50 parts by weight, more preferably 2 to 30 parts by weight per 100 parts by weight of the sulfo-bearing novolac resin.

An acid generator may be added to the undercoat-forming material of the invention to accelerate the thermally induced crosslinking reaction. Acid generators include those which generate an acid through pyrolysis and those which generate an acid upon exposure to light, and both are useful.

The acid generators used herein include those described in US 2008038662A1 (JP-A 2008-65303, paragraphs [0081] to [0111]). The ammonium salts of imidate and methidate described in JP-A 2008-39811 are useful as the thermal acid generator. Those ammonium salts of sulfonic acids may be added which do not correspond to perfluoroalkyl sulfonic acids (PFAS) having fluorine substituted at α-position other than trifluoromethanesulfonic acid, perfluorobutanesulfonic acid and perfluorooctylsulfonic acid as described in JP-A 2008-39815. The acid generator is preferably compounded in an amount of 0.001 to 30 parts by weight, more preferably 0.1 to 20 parts by weight per 100 parts by weight of the sulfo-bearing novolac resin.

In the undercoat-forming material of the invention, a basic compound may be compounded for improving the storage stability by neutralizing the sulfo group into an amine salt and by preventing crosslinking reaction from proceeding during storage at room temperature when a crosslinker is added.

Suitable basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene; and pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

The basic compound is preferably formulated in an amount of 0.1 to 2 moles, and especially 0.5 to 1.5 moles, per mole of sulfo group. Less than 0.1 mole of the basic compound may fail to provide the desired effect whereas more than 2 moles of the basic compound may trap the entirety of thermally generated acid to inhibit crosslinking reaction or detract from the anti-poisoning effect.

The organic solvent used in the undercoat-forming material of the invention may be any organic solvent in which the base polymer, acid generator, crosslinker and other components are soluble. Illustrative, non-limiting, examples of the organic solvent include ketones such as cyclohexanone and methyl-2-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, preferred are diethylene glycol dimethyl ether, 1-ethoxy-2-propanol, ethyl lactate, PGMEA, propylene glycol monomethyl ether, and mixtures thereof.

The organic solvent is preferably added in an amount of 200 to 10,000 parts by weight, especially 300 to 5,000 parts by weight per 100 parts by weight of the base polymer.

Process

It is now described how to form a pattern using the undercoat-forming material of the invention.

Like photoresists, the undercoat material of the invention can be applied onto a processable substrate by any desired technique such as spin coating, to form an undercoat layer thereon. After spin coating, the coating is desirably baked in order to evaporate off the solvent and to promote crosslinking reaction for preventing the undercoat layer from intermixing with the top resist layer. The baking is preferably effected at a temperature of 80 to 450° C. for a time of 10 to 600 seconds. The thickness of the undercoat layer may be suitably determined although it is preferably in the range of 10 to 20,000 nm, especially 30 to 15,000 nm. After the undercoat layer is formed, a silicon-containing intermediate layer is formed thereon and a silicon-free single-layer resist layer is further formed on the intermediate layer in the case of the trilayer process. An ordinary antireflective coating of silicon-free hydrocarbon based material may also be formed. The photoresist composition for forming the resist layer may be well-known one.

As the silicon-containing intermediate layer for the trilayer process, an intermediate layer based on polysilsesquioxane is preferably used. The provision of the intermediate layer with a function of antireflective coating is effective in holding down reflection.

Especially for 193-nm exposure, while the use of an aromatic group-rich material having high resistance to substrate etching as the undercoat layer provides a high k value and high substrate reflection, the combined use of an intermediate layer that restrains reflection is successful in reducing the substrate reflectance to 0.5% or less.

In immersion lithography using an exposure tool with a NA of at least 1.0, the incident angle of light is very shallow. To suppress substrate reflection, the trilayer resist process including a silicon-containing intermediate layer having an ARC function is effective. Yet substrate reflection increases as the incident angle of light becomes shallower (or NA increases). See Proc. SPIE Vol. 6153 p61530K (2006).

According to Snell's law, the refractive index must be increased in order to deepen the incident angle of light. Notably, there is an optimum value of refractive index since too high a refractive index leads to increased reflection. In FIG. 1, substrate reflection is the lowest at a refractive index of around 1.8, which corresponds to an undercoat layer having a slightly higher refractive index than the resist's refractive index of 1.7. When immersion lithography using an exposure tool with a NA in excess of 1.0 is combined with the trilayer resist process including a silicon-containing intermediate layer having an ARC function, the substrate reflection becomes significantly higher, approaching the reflection behavior of only one undercoat layer shown in FIG. 1. In immersion lithography using an exposure tool with a NA in excess of 1.0, even when combined with the trilayer resist process including a silicon-containing intermediate layer having an ARC function, reflection becomes higher if the n and k values of the undercoat layer are outside their optimum, and therefore, more optimization is necessary than in the case of dry lithography using an exposure tool with a NA of up to 1.0. Although the ideal value of n is 1.8 or slightly higher than the resist's refractive index of 1.7, the reflectance can be reduced to or below 1% as long as the value of n is equal to or higher than 1.5. Although the ideal value of k is 0.3, the reflectance can be reduced to or below 1% as long as the value of k is in the range of 0.2 to 0.45. As long as the reflectance is 1%, no corrugation due to standing waves is found on the sidewalls of resist.

Since naphthalene has less absorption at wavelength 193 nm, naphthol novolac resins, for example, have a k value of about 0.4, which is sufficient for use in the trilayer process. However, their n value is as low as about 1.4. Use of aromatic groups has the drawback that if an attempt is made to reduce the k value by stretching the conjugation to shift the absorption maximum wavelength to the longer wavelength side, the peak of n value is also shifted to the longer wavelength side and becomes lower in value.

Introduction of sulfur atom is effective in increasing the refractive index. Since sulfur does not function to shift absorption in increasing the refractive index, a high value of n and a relatively low value of k are characteristic. Then introduction of a sulfo group, which contains sulfur, leads to an increased refractive index, so that an aromatic rich undercoat layer material may have a refractive index approximate to the ideal.

As the intermediate layer having an antireflection effect, use is preferably made of acid or heat-crosslinkable polysilsesquioxane with anthracenyl groups as pendants for 248-nm and 157-nm exposure, and acid or heat-crosslinkable polysilsesquioxane with phenyl groups or silicon-silicon bond-bearing photo-absorbing groups as pendants for 193-nm exposure.

Also, an intermediate layer formed by chemical vapor deposition (CVD) may be used. Know intermediate layers formed by CVD and fully effective as an antireflective coating are SiON coatings. As compared with the CVD, formation of an intermediate layer by a spin coating technique is simple and economical. The top layer resist material in the trilayer process may be either positive or negative and may be the same as a commonly used single-layer resist material.

When the photoresist composition is applied to form a resist layer, a spin coating technique is preferably used as in the case of the undercoat layer. The resist composition is spin coated and then pre-baked, preferably at 80 to 180° C. for 10 to 300 seconds. Thereafter, the resist layer is routinely exposed to radiation through a desired pattern, post-exposure baked (PEB) and developed with a developer, obtaining a resist pattern. The thickness of the resist layer is preferably in a range of 30 to 500 nm, more preferably 50 to 400 nm, though not particularly limited. The radiation for exposure may be selected from among high-energy radiation having a wavelength of up to 300 nm, specifically excimer laser beams of 248 nm, 193 nm and 157 nm, soft X-ray (EUV) of 3 to 20 nm, electron beam (EB), and X-ray.

Next, etching is carried out using the resist pattern as a mask. In the bilayer process, the undercoat layer is typically etched with oxygen gas while using the silicon-containing photoresist pattern as a mask. In addition to oxygen gas, an inert gas such as He or Ar or another gas such as CO. $CO_2$, $NH_3$, $SO_2$, $N_2$, $NO_2$ or $H_2$ may be added to the etchant gas. The other gas is used for sidewall protection, that is, for preventing the pattern sidewalls from being undercut. Etching solely with CO, $CO_2$, $NH_3$, $SO_2$, $NO_2$ or $H_2$ gas without using oxygen gas is also acceptable. In the trilayer process, the silicon-containing intermediate layer is etched with a fluorocarbon-base gas using the resist pattern as a mask. Then the undercoat layer is etched with oxygen gas (same as above) using the intermediate layer pattern as a mask.

Next, the processable substrate is etched by a standard technique. For example, when the substrate is $SiO_2$ or SiN, etching with a fluorocarbon-base gas is employed. When the substrate is p-Si, Al or W, etching with a chlorine or bromine-base gas is employed. When the substrate processing is etching with a fluorocarbon-base gas, the silicon-containing resist in the bilayer resist process and the silicon-containing intermediate layer in the trilayer process are stripped at the same time as the substrate processing. When the substrate is etched with a chlorine or bromine-base gas, the silicon-containing resist or the silicon-containing intermediate layer must be subsequently stripped by dry etching with a fluorocarbon-base gas after the substrate processing.

The undercoat layer of the invention is characterized by resistance to etching of the processable substrate.

The processable substrate is formed on a support substrate. The support substrate includes those of Si, α-Si, p-Si, $SiO_2$, SiN, SiON, W, TiN, Al and the like, and a suitable material different from the processable film (or processable substrate) is selected among them. The processable film is selected from low-k films of Si, $SiO_2$, SiON, SiN, p-Si, α-Si, W, W—Si, Al, Cu, Al—Si, Cr, CrO, CrN, MoSi and the like and stop films thereof, and typically has a thickness of 50 to 10,000 nm, especially 100 to 5,000 nm.

The patterning process of the invention includes the step of applying the photoresist undercoat layer-forming material onto a substrate to form an undercoat layer. A photoresist composition is applied onto the undercoat layer, optionally via an intermediate layer, to form a photoresist layer. The photoresist layer in a predetermined region is exposed to radiation, and developed with a liquid developer to form a photoresist pattern. Using a dry etching apparatus, the undercoat layer and the substrate are processed through the patterned photoresist layer as a mask. As one example of bi- and tri-layer resist working processes, the trilayer resist working process is described below.

Referring to FIG. 6, the trilayer resist working process is described. An undercoat layer 12 is formed on a processable substrate 11a lying on a support substrate 11b, a silicon-containing intermediate layer 14 is formed on the undercoat layer 12, and a single-layer photoresist layer 13 is formed thereon (FIG. 6A). Then a predetermined region 13' of the photoresist layer 13 is exposed to radiation (FIG. 6B), PEB, and developed, forming a patterned photoresist layer 13 (FIG. 6C). The intermediate layer 14 is etched with CF gas through the patterned photoresist layer 13 as a mask (FIG. 6D). The patterned photoresist layer is removed, and the undercoat layer 12 is processed by oxygen plasma etching through the patterned intermediate layer 14 as a mask (FIG. 6E). The patterned intermediate layer 13 is removed, and the processable substrate 11a is processed by etching (FIG. 6F).

EXAMPLE

Synthesis Examples and Examples are given below together with Comparative Examples for further illustrating the invention although the invention is not limited thereby.

The weight average molecular weight (Mw) and number average molecular weight (Mn) of a polymer are determined by gel permeation chromatography (GPC) versus polystyrene standards, and a dispersity (Mw/Mn) is computed therefrom.

Synthesis Example 1

A 300-ml flask was charged with 208 g of naphthalene-1-sulfonic acid and 30 g of 37% formalin. With stirring, reaction occurred at 100° C. for 4 hours. The reaction product was dissolved in 500 ml of methyl isobutyl ketone and thoroughly washed with water to remove the catalyst and metal impurities. The solvent was distilled off under a reduced pressure, and the system was further evacuated to 2 mmHg at 150° C. for removing the water and unreacted monomer, yielding the formaldehyde condensate of naphthalenesulfonic acid, designated Polymer 1.

The polymer was determined for Mw and Mw/Mn by GPC and analyzed for composition by $^1$H-NMR.
Mw=1,800
Mw/Mn=5.20

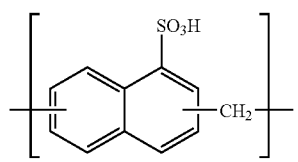

Polymer 1

Synthesis Example 2

A 300-ml flask was charged with 158 g of benzenesulfonic acid and 30 g of 37% formalin. With stirring, reaction occurred at 100° C. for 4 hours. The reaction product was dissolved in 500 ml of methyl isobutyl ketone and thoroughly washed with water to remove the catalyst and metal impurities. The solvent was distilled off under a reduced pressure, and the system was further evacuated to 2 mmHg at 150° C. for removing the water and unreacted monomer, yielding the formaldehyde condensate of benzenesulfonic acid, designated Polymer 2.

The polymer was determined for Mw and Mw/Mn by GPC and analyzed for composition by $^1$H-NMR.
Mw=2,200
Mw/Mn=7.40

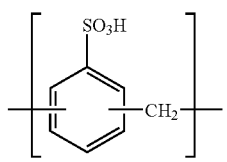

Polymer 2

Synthesis Example 3

To 46 g of the formaldehyde condensate of naphthalenesulfonic acid (Polymer 1) in Synthesis Example 1 were added 50 g of water and 115 g of 1-naphthol and further 30 g of 37% formalin. With stirring, reaction occurred at 100° C. for 4 hours. The reaction product was dissolved in 500 ml of methyl isobutyl ketone and thoroughly washed with water to remove the metal impurities. The solvent was distilled off under a reduced pressure, and the system was further evacuated to 2 mmHg at 150° C. for removing the water and unreacted monomer, yielding the copolycondensate, designated Polymer 3.

The polymer was determined for Mw and Mw/Mn by GPC and analyzed for composition by $^1$H-NMR.
Mw=4,900
Mw/Mn=6.90

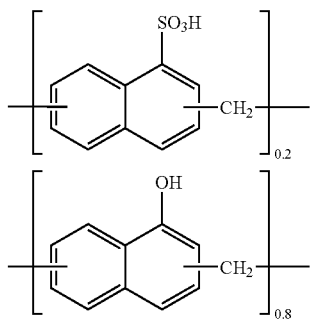

Polymer 3

Synthesis Example 4

To 46 g of the formaldehyde condensate of naphthalenesulfonic acid (Polymer 1) in Synthesis Example 1 were added 50 g of water and 280 g of Compound 1, and further 30 g of 37% formalin. With stirring, reaction occurred at 100° C. for 4 hours. The reaction product was dissolved in 500 ml of methyl isobutyl ketone and thoroughly washed with water to remove the metal impurities. The solvent was distilled off under a reduced pressure, and the system was further evacuated to 2 mmHg at 150° C. for removing the water and unreacted monomer, yielding the copolycondensate, designated Polymer 4.

The polymer was determined for Mw and Mw/Mn by GPC and analyzed for composition by $^1$H-NMR.
Mw=6,600
Mw/Mn=5.90

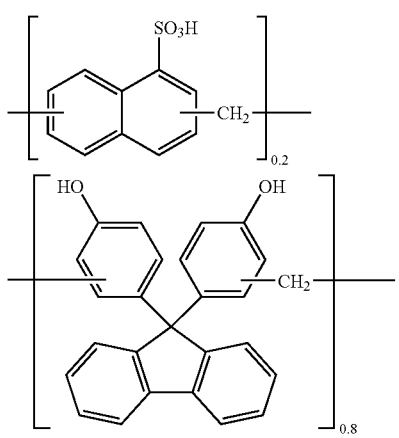

Synthesis Example 5

To 46 g of the formaldehyde condensate of naphthalenesulfonic acid (Polymer 1) in Synthesis Example 1 were added 50 g of water and 320 g of Compound 2, and further 30 g of 37% formalin. With stirring, reaction occurred at 100° C. for 4 hours. The reaction product was dissolved in 500 ml of methyl isobutyl ketone and thoroughly washed with water to remove the metal impurities. The solvent was distilled off under a reduced pressure, and the system was further evacuated to 2 mmHg at 150° C. for removing the water and unreacted monomer, yielding the copolycondensate, designated Polymer 5.

The polymer was determined for Mw and Mw/Mn by GPC and analyzed for composition by $^1$H-NMR.
Mw=5,300
Mw/Mn=6.10

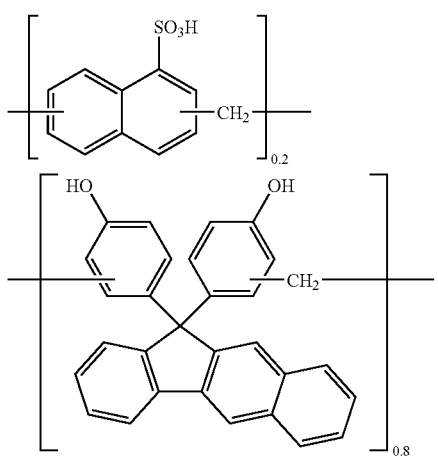

Synthesis Example 6

To 62 g of the formaldehyde condensate of naphthalenesulfonic acid (Polymer 1) in Synthesis Example 1 were added 50 g of water and 315 g of Compound 3, and further 30 g of 37% formalin. With stirring, reaction occurred at 100° C. for 4 hours. The reaction product was dissolved in 500 ml of methyl isobutyl ketone and thoroughly washed with water to remove the metal impurities. The solvent was distilled off under a reduced pressure, and the system was further evacuated to 2 mmHg at 150° C. for removing the water and unreacted monomer, yielding the copolycondensate, designated Polymer 6.

The polymer was determined for Mw and Mw/Mn by GPC and analyzed for composition by $^1$H-NMR.
Mw=4,400
Mw/Mn=7.40

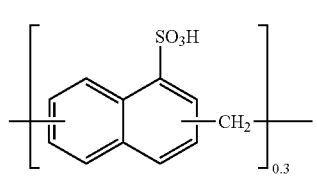

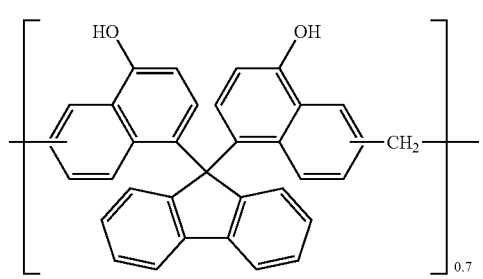

Synthesis Example 7

To 62 g of the formaldehyde condensate of naphthalenesulfonic acid (Polymer 1) in Synthesis Example 1 were added 50 g of water and 298 g of Compound 4, and further 30 g of 37% formalin. With stirring, reaction occurred at 100° C. for 4 hours. The reaction product was dissolved in 500 ml of methyl isobutyl ketone and thoroughly washed with water to remove the metal impurities. The solvent was distilled off under a reduced pressure, and the system was further evacuated to 2 mmHg at 150° C. for removing the water and unreacted monomer, yielding the copolycondensate, designated Polymer 7.

The polymer was determined for Mw and Mw/Mn by GPC and analyzed for composition by $^1$H-NMR.
Mw=5,900
Mw/Mn=7.10

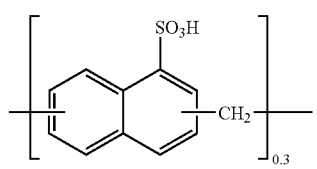

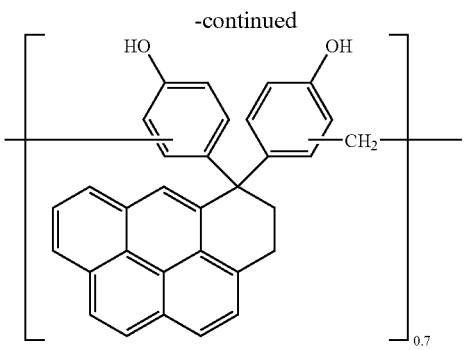

Synthesis Example 8

To 62 g of the formaldehyde condensate of naphthalenesulfonic acid (Polymer 1) in Synthesis Example 1 were added 50 g of water and 224 g of Compound 5, and further 30 g of 37% formalin. With stirring, reaction occurred at 100° C. for 4 hours. The reaction product was dissolved in 500 ml of methyl isobutyl ketone and thoroughly washed with water to remove the metal impurities. The solvent was distilled off under a reduced pressure, and the system was further evacuated to 2 mmHg at 150° C. for removing the water and unreacted monomer, yielding the copolycondensate, designated Polymer 8.

The polymer was determined for Mw and Mw/Mn by GPC and analyzed for composition by $^1$H-NMR.
Mw=8,800
Mw/Mn=7.70

Polymer 8

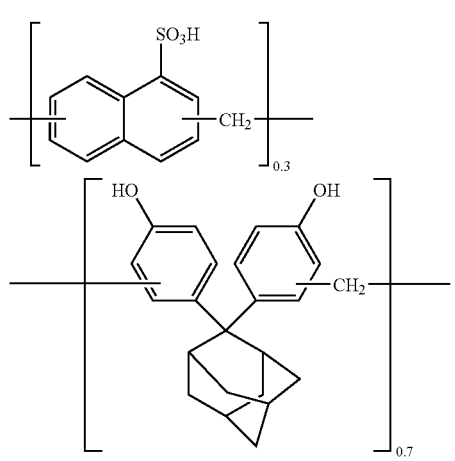

Synthesis Example 9

To 62 g of the formaldehyde condensate of naphthalenesulfonic acid (Polymer 1) in Synthesis Example 1 were added 50 g of water and 194 g of Compound 6, and further 30 g of 37% formalin. With stirring, reaction occurred at 100° C. for 4 hours. The reaction product was dissolved in 500 ml of methyl isobutyl ketone and thoroughly washed with water to remove the metal impurities. The solvent was distilled off under a reduced pressure, and the system was further evacuated to 2 mmHg at 150° C. for removing the water and unreacted monomer, yielding the copolycondensate, designated Polymer 9.

The polymer was determined for Mw and Mw/Mn by GPC and analyzed for composition by $^1$H-NMR.
Mw=4,900
Mw/Mn=5.80

Polymer 9

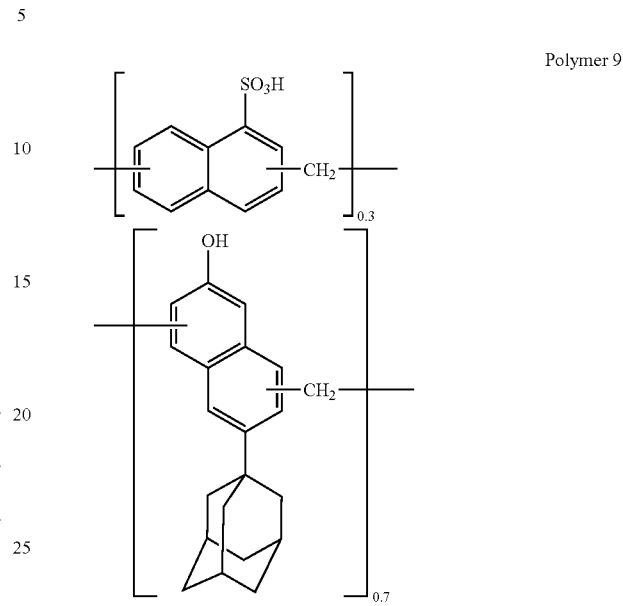

Synthesis Example 10

To 83 g of the formaldehyde condensate of naphthalenesulfonic acid (Polymer 1) in Synthesis Example 1 were added 50 g of water and 201 g of Compound 7, and further 30 g of 37% formalin. With stirring, reaction occurred at 100° C. for 4 hours. The reaction product was dissolved in 500 ml of methyl isobutyl ketone and thoroughly washed with water to remove the metal impurities. The solvent was distilled off under a reduced pressure, and the system was further evacuated to 2 mmHg at 150° C. for removing the water and unreacted monomer, yielding the copolycondensate, designated Polymer 10.

The polymer was determined for Mw and Mw/Mn by GPC and analyzed for composition by $^1$H-NMR.
Mw=4,600
Mw/Mn=6.20

Polymer 10

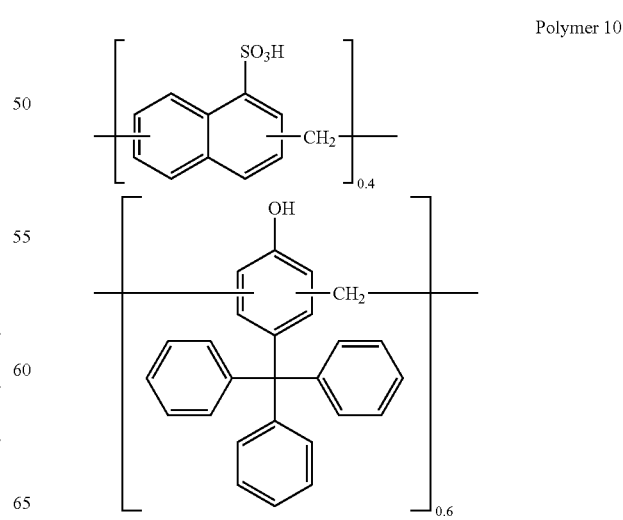

Synthesis Example 11

To 62 g of the formaldehyde condensate of naphthalenesulfonic acid (Polymer 1) in Synthesis Example 1 were added 50 g of water and 201 g of Compound 8, and further 30 g of 37% formalin. With stirring, reaction occurred at 100° C. for 4 hours. The reaction product was dissolved in 500 ml of methyl isobutyl ketone and thoroughly washed with water to remove the metal impurities. The solvent was distilled off under a reduced pressure, and the system was further evacuated to 2 mmHg at 150° C. for removing the water and unreacted monomer, yielding the copolycondensate, designated Polymer 11.

The polymer was determined for Mw and Mw/Mn by GPC and analyzed for composition by $^1$H-NMR.

Mw=6,400
Mw/Mn=7.20

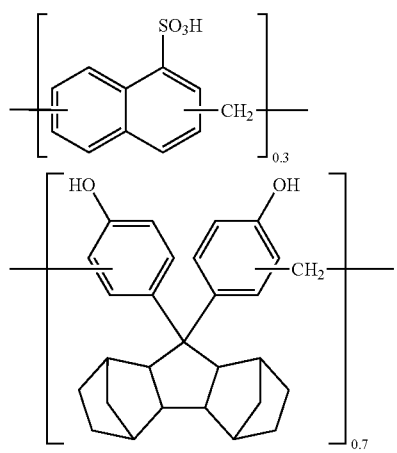

Polymer 11

Synthesis Example 12

To 46 g of the formaldehyde condensate of naphthalenesulfonic acid (Polymer 1) in Synthesis Example 1 were added 33 g of 1-pyrenesulfonic acid, 50 g of water and 115 g of 1-naphthol, and further 30 g of 37% formalin. With stirring, reaction occurred at 100° C. for 4 hours. The reaction product was dissolved in 500 ml of methyl isobutyl ketone and thoroughly washed with water to remove the metal impurities. The solvent was distilled off under a reduced pressure, and the system was further evacuated to 2 mmHg at 150° C. for removing the water and unreacted monomer, yielding the copolycondensate, designated Polymer 12.

The polymer was determined for Mw and Mw/Mn by GPC and analyzed for composition by $^1$H-NMR.

Mw=3,200
Mw/Mn=5.20

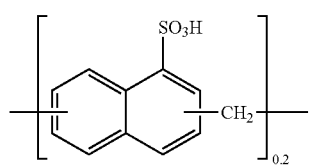

Polymer 12

-continued

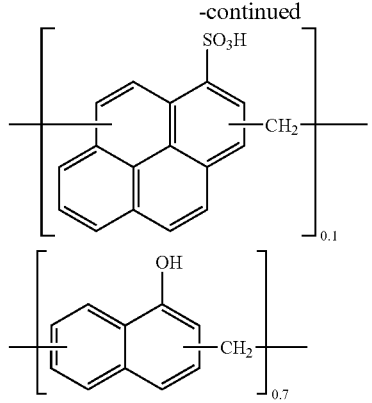

Synthesis Example 13

To 46 g of the formaldehyde condensate of naphthalenesulfonic acid (Polymer 1) in Synthesis Example 1 were added 31 g of 2-anthracenesulfonic acid, 50 g of water and 115 g of 1-naphthol, and further 30 g of 37% formalin. With stirring, reaction occurred at 100° C. for 4 hours. The reaction product was dissolved in 500 ml of methyl isobutyl ketone and thoroughly washed with water to remove the metal impurities. The solvent was distilled off under a reduced pressure, and the system was further evacuated to 2 mmHg at 150° C. for removing the water and unreacted monomer, yielding the copolycondensate, designated Polymer 13.

The polymer was determined for Mw and Mw/Mn by GPC and analyzed for composition by $^1$H-NMR.

Mw=6,400
Mw/Mn=6.60

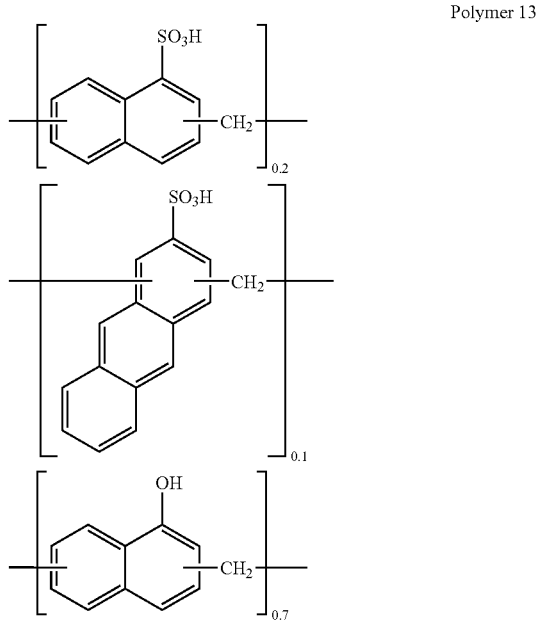

Polymer 13

Synthesis Example 14

To 46 g of the formaldehyde condensate of naphthalenesulfonic acid (Polymer 1) in Synthesis Example 1 were added 31 g of 3-phenanthrenesulfonic acid, 50 g of water and 115 g of 1-naphthol, and further 30 g of 37% formalin. With stirring, reaction occurred at 100° C. for 4 hours. The reaction product was dissolved in 500 ml of methyl isobutyl ketone and thoroughly washed with water to remove the metal impurities. The solvent was distilled off under a reduced pressure, and the system was further evacuated to 2 mmHg at 150° C. for removing the water and unreacted monomer, yielding the copolycondensate, designated Polymer 14.

The polymer was determined for Mw and Mw/Mn by GPC and analyzed for composition by $^1$H-NMR.

Mw=3,200
Mw/Mn=5.20

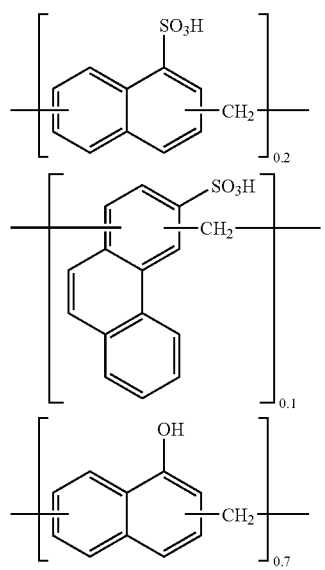

Polymer 14

Synthesis Example 15

To 42 g of the formaldehyde condensate of benzenesulfonic acid (Polymer 2) in Synthesis Example 2 were added 50 g of water and 315 g of Compound 3, and further 30 g of 37% formalin. With stirring, reaction occurred at 100° C. for 4 hours. The reaction product was dissolved in 500 ml of methyl isobutyl ketone and thoroughly washed with water to remove the metal impurities. The solvent was distilled off under a reduced pressure, and the system was further evacuated to 2 mmHg at 150° C. for removing the water and unreacted monomer, yielding the copolycondensate, designated Polymer 15.

The polymer was determined for Mw and Mw/Mn by GPC and analyzed for composition by $^1$H-NMR.

Mw=8,100
Mw/Mn=8.40

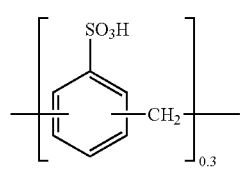

Polymer 15

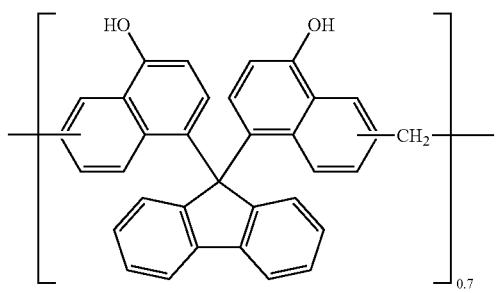

Polymer 15

Synthesis Example 16

To a mixture of 146 g of naphthalenesulfonic acid and 42 g of dicyclopentadiene was added 0.2 g of trifluoromethanesulfonic acid. With stirring, reaction occurred at 100° C. for 4 hours. The reaction product was dissolved in 500 ml of methyl isobutyl ketone and thoroughly washed with water to remove the metal impurities. The solvent was distilled off under a reduced pressure, and the system was further evacuated to 2 mmHg at 150° C. for removing the water and unreacted monomer, yielding the copolycondensate, designated Polymer 16.

The polymer was determined for Mw and Mw/Mn by GPC and analyzed for composition by $^1$H-NMR.

Mw=4,100
Mw/Mn=5.90

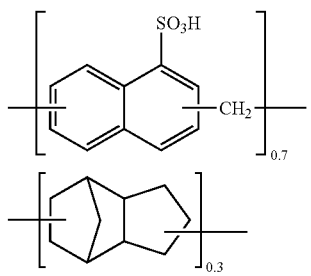

Polymer 16

Synthesis Example 17

To a mixture of 146 g of naphthalenesulfonic acid and 59 g of tricyclopentadiene was added 0.2 g of trifluoromethanesulfonic acid. With stirring, reaction occurred at 100° C. for 4 hours. The reaction product was dissolved in 500 ml of methyl isobutyl ketone and thoroughly washed with water to remove the metal impurities. The solvent was distilled off under a reduced pressure, and the system was further evacuated to 2 mmHg at 150° C. for removing the water and unreacted monomer, yielding the copolycondensate, designated Polymer 17.

The polymer was determined for Mw and Mw/Mn by GPC and analyzed for composition by $^1$H-NMR.

Mw=3,700
Mw/Mn=5.90

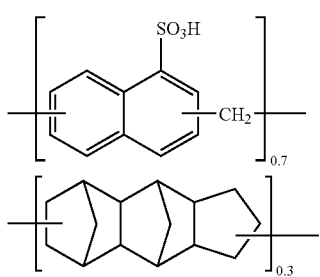

Polymer 17

Synthesis Example 18

To 46 g of the formaldehyde condensate of naphthalenesulfonic acid (Polymer 1) in Synthesis Example 1 were added 82 g of 1,5-naphthalenedimethanol and 50 g of water, and further 30 g of 37% formalin. With stirring, reaction occurred at 100° C. for 4 hours. The reaction product was dissolved in 500 ml of methyl isobutyl ketone and thoroughly washed with water to remove the metal impurities. The solvent was distilled off under a reduced pressure, and the system was further evacuated to 2 mmHg at 150° C. for removing the water and unreacted monomer, yielding the copolycondensate, designated Polymer 18.

The polymer was determined for Mw and Mw/Mn by GPC and analyzed for composition by $^1$H-NMR.
Mw=6,900
Mw/Mn=5.90

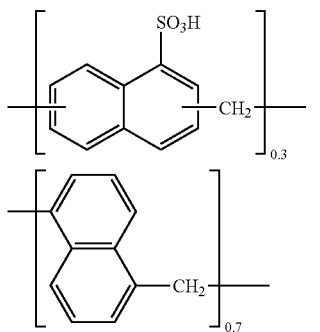

Polymer 18

Synthesis Example 19

To 46 g of the formaldehyde condensate of naphthalenesulfonic acid (Polymer 1) in Synthesis Example 1 were added 116 g of 2,8-fluorenedimethanol and 50 g of water, and further 30 g of 37% formalin. With stirring, reaction occurred at 100° C. for 4 hours. The reaction product was dissolved in 500 ml of methyl isobutyl ketone and thoroughly washed with water to remove the metal impurities. The solvent was distilled off under a reduced pressure, and the system was further evacuated to 2 mmHg at 150° C. for removing the water and unreacted monomer, yielding the copolycondensate, designated Polymer 19.

The polymer was determined for Mw and Mw/Mn by GPC and analyzed for composition by $^1$H-NMR.
Mw=9,100
Mw/Mn=7.60

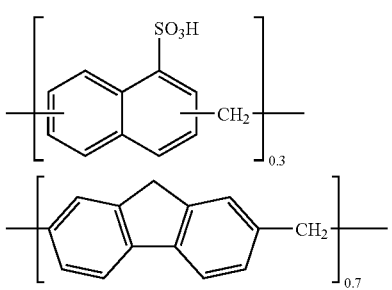

Polymer 19

Comparative Synthesis Example 1

A 500-ml flask was charged with 40 g of 4-hydroxystyrene, 160 g of 2-methacrylic acid-1-adamantane, and 40 g of toluene as a solvent. With the reactor kept in a nitrogen blanket, steps of cooling to −70° C., vacuum deaeration and nitrogen flow were repeated three cycles. After the reactor was allowed to warm up to room temperature, 4.1 g of azobisisobutyronitrile (AIBN) was added as a polymerization initiator, and the reactor was heated up to 80° C., at which reaction ran for 24 hours. The reaction solution was concentrated to a half volume and precipitated from a mixture of 300 ml of methanol and 50 ml of water. The white solid thus obtained was filtered and dried in vacuum at 60° C., obtaining 188 g of a white polymer, designated Comparative Polymer 1.

The polymer was determined for Mw and Mw/Mn by GPC and analyzed for composition by $^1$H-NMR.

Copolymerization ratio (mole): 4-hydroxystyrene/2-methacrylic acid-1-adamantane=0.32/0.68
Mw=10,900
Mw/Mn=1.77

Compounds 1 to 8 used in the foregoing Synthesis Examples are shown below.

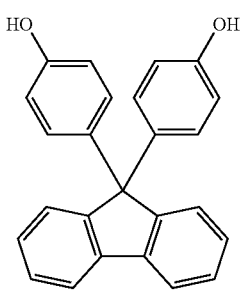

Compound 1

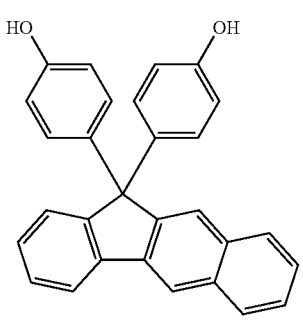

Compound 2

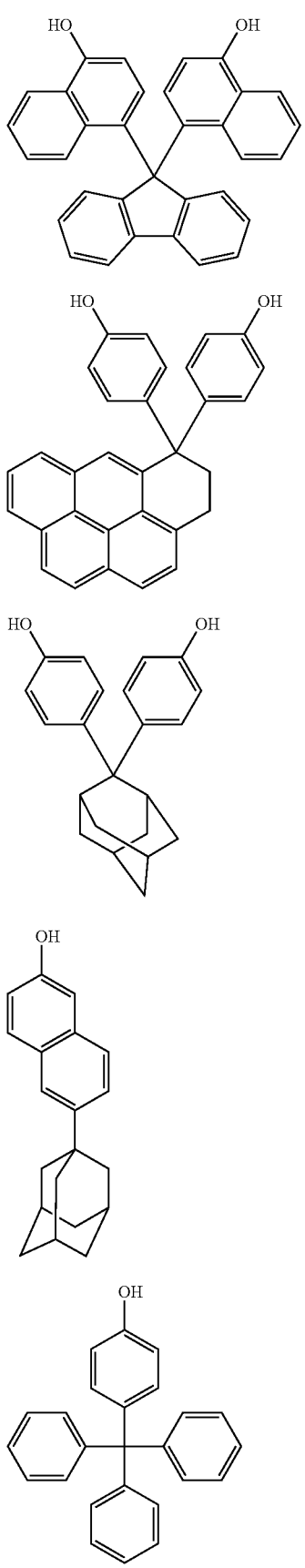

Compound 3

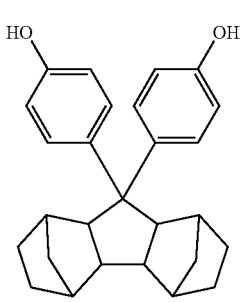

Compound 4

Preparation of Undercoat Material

Resist undercoat layer-forming materials (Examples and Comparative Examples) were prepared by dissolving a resin component (Polymers 1 to 19, Comparative Polymers 1 and 2), blending oligomer 1, blending phenol low-nucleus compounds 1 to 3, an acid generator (AG1), and a crosslinker (CR1, 2) in an organic solvent containing 0.1 wt % of Fluorad FC-430 (3M-Sumitomo Co., Ltd.) according to the formulation shown in Table 1, and passing through a fluoroplastic filter having a pore size of 0.1 μm.

Compound 5

Polymers 1 to 19: polymers obtained in Synthesis Examples 1 to 19

Comparative Polymer 1: polymer obtained in Comparative Synthesis Example 1

Comparative Polymer 2: a cresol novolac resin having an m/p ratio of 0.4/0.6, Mw=8,000 and Mw/Mn=4.5

Blending Oligomer 1:

Compound 6

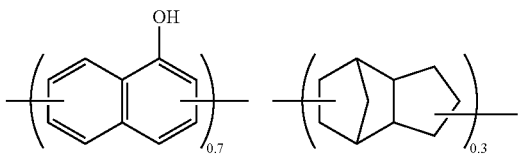

Blending oligomer 1

Mw = 970, Mw/Mn = 4.5

Blending Phenol Low-Nucleus Compounds 1 to 3:

Compound 7

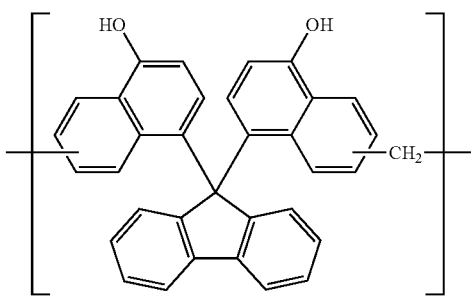

Phenol low-nucleus compound 1
Mw = 3,800, Mw/Mn = 6.8

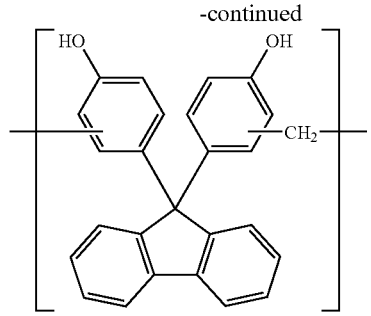

Phenol low-nucleus compound 2
Mw = 6,500, Mw/Mn = 5.5

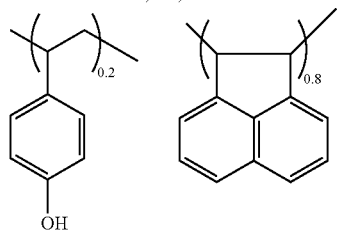

Phenol low-nucleus compound 3
Mw = 5,300, Mw/Mn = 1.83

Acid Generator: AG1

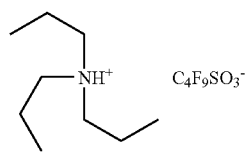

Crosslinkers: CR1 and CR2

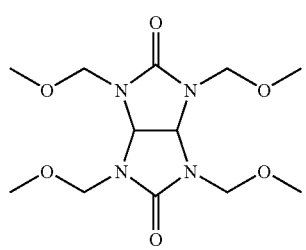

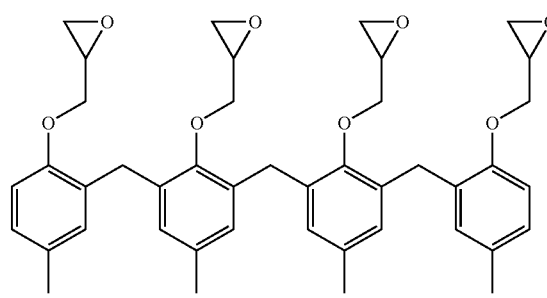

Organic Solvents:
PGMEA=propylene glycol monomethyl ether acetate
CyH=cyclohexanone Intermediate Layer Polymer 1:

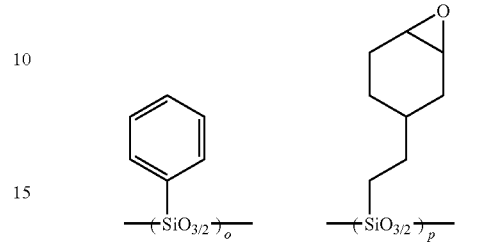

ArF silicon-containing intermediate layer polymer 1
(o = 0.20, p = 0.8, Mw = 3,300)

Examples and Comparative Examples

Undercoat-coating solutions and an intermediate layer-coating solution were prepared by dissolving a resin component (Polymers 1 to 19, Comparative Polymers 1 and 2) or ArF silicon-containing intermediate layer polymer 1, blending oligomer 1, blending phenol low-nucleus compounds 1 to 3, an acid generator (AG1), and a crosslinker (CR1, 2) in a solvent containing 0.1 wt % of Fluorad FC-4430 (3M-Sumitomo Co., Ltd.) according to the formulation shown in Table 1, and passing through a fluoroplastic filter having a pore size of 0.1 μm.

Each undercoat-forming material solution was applied onto a silicon substrate and baked at 300° C. for 60 seconds in the case of UDL-1 to 25 and Comparative UDL-3, or at 200° C. for 60 seconds in the case of Comparative UDL-1, 2 to form an undercoat layer of 200 nm thick. The intermediate layer-forming material solution was spin coated and baked at 200° C. for 60 seconds to form a silicon-containing intermediate layer (SOG1) of 70 nm thick. Using a variable angle spectroscopic ellipsometer (VASE®) of J. A. Woollam Co., the refractive index (n, k) at wavelength 193 nm of the undercoat layers (UDL-1 to 25, Comparative UDL-1 to 3) or intermediate layer (SOG1) was determined. The results are shown in Table 1.

A single-layer resist solution was prepared by dissolving a resin, acid generator, and basic compound in a solvent containing 0.1 wt % of Fluorad FC-4430 (3M-Sumitomo Co., Ltd.) according to the formulation shown in Table 2, and passing through a fluoroplastic filter having a pore size of 0.1 μm.

TABLE 1

| | Polymer (pbw) | Blending polymer or oligomer (pbw) | Amine (pbw) | Cross-linker (pbw) | Acid generator (pbw) | Organic solvent (pbw) | Refractive index @193 nm n | k |
|---|---|---|---|---|---|---|---|---|
| UDL-1 | Polymer 1 (4) | Phenol low-nucleus 1 (16) | — | — | — | PGMEA(80) CyH(20) | 1.50 | 0.32 |
| UDL-2 | Polymer 2 (4) | Phenol low-nucleus 1 (16) | — | — | — | PGMEA(80) CyH(20) | 1.48 | 0.38 |
| UDL-3 | Polymer 1 (4) | Phenol low-nucleus 2 (16) | — | — | — | PGMEA(80) CyH(20) | 1.46 | 0.48 |
| UDL-4 | Polymer 1 (4) | Phenol low-nucleus 3 (16) | — | — | — | PGMEA(80) CyH(20) | 1.52 | 0.32 |
| UDL-5 | Polymer 1 (4) | Phenol low-nucleus 1 (8) Blending oligomer 1 (8) | — | — | — | PGMEA (80) CyH (20) | 1.55 | 0.30 |
| UDL-6 | Polymer 3 (20) | — | — | — | — | PGMEA (100) | 1.49 | 0.35 |
| UDL-7 | Polymer 4 (20) | — | — | — | — | PGMEA (100) | 1.46 | 0.49 |
| UDL-8 | Polymer 5 (20) | — | — | — | — | PGMEA (100) | 1.48 | 0.42 |
| UDL-9 | Polymer 6 (20) | — | — | — | — | PGMEA (100) | 1.52 | 0.37 |
| UDL-10 | Polymer 7 (20) | — | — | — | — | PGMEA (100) | 1.51 | 0.39 |
| UDL-11 | Polymer 8 (20) | — | — | — | — | PGMEA (100) | 1.55 | 0.43 |
| UDL-12 | Polymer 9 (20) | — | — | — | — | PGMEA (100) | 1.58 | 0.29 |
| UDL-13 | Polymer 10 (20) | — | — | — | — | PGMEA (100) | 1.48 | 0.46 |
| UDL-14 | Polymer 11 (20) | — | — | — | — | PGMEA (100) | 1.62 | 0.28 |
| UDL-15 | Polymer 12 (20) | — | — | — | — | PGMEA (100) | 1.50 | 0.38 |
| UDL-16 | Polymer 13 (20) | — | — | — | — | PGMEA (100) | 1.50 | 0.39 |
| UDL-17 | Polymer 14 (20) | — | — | — | — | PGMEA (100) | 1.51 | 0.38 |
| UDL-18 | Polymer 15 (20) | — | — | — | — | PGMEA (100) | 1.51 | 0.38 |
| UDL-19 | Polymer 6 (10) | Polymer 16 (10) | — | — | — | PGMEA (100) | 1.57 | 0.30 |
| UDL-20 | Polymer 6 (10) | Polymer 17 (10) | — | — | — | PGMEA (100) | 1.60 | 0.29 |
| UDL-21 | Polymer 6 (20) | — | triethylamine (5) | — | — | PGMEA (100) | 1.52 | 0.37 |
| UDL-22 | Polymer 6 (20) | — | triethylamine (5) | CR1 (2) | — | PGMEA (100) | 1.53 | 0.35 |
| UDL-23 | Polymer 6 (20) | — | triethylamine (5) | CR2 (2) | AG1 (1) | PGMEA (100) | 1.48 | 0.39 |
| UDL-24 | Polymer 18 (20) | — | — | — | — | PGMEA (100) | 1.44 | 0.39 |
| UDL-25 | Polymer 19 (20) | — | — | — | — | PGMEA (100) | 1.42 | 0.43 |
| SOG1 | ArF silicon-containing intermediate layer polymer 1 (20) | — | — | — | AG1 (1) | PGMEA (100) | 1.66 | 0.15 |
| Comparative UDL-1 | Comparative Polymer 1 (20) | — | — | CR1 (2) | AG1 (1) | PGMEA (100) | 1.38 | 0.35 |
| Comparative UDL-2 | Comparative Polymer 2 (20) | — | — | CR1 (2) | AG1 (1) | PGMEA (100) | 1.28 | 0.62 |
| Comparative UDL-3 | Phenol low-nucleus 2 (20) | — | — | CR1 (2) | AG1 (1) | PGMEA (100) | 1.32 | 0.68 |

TABLE 2

| | Polymer (pbw) | Acid generator (pbw) | Basic compound (pbw) | Organic solvent (pbw) |
|---|---|---|---|---|
| Ar SL resist | ArF SL resist polymer 1 (100) | PAG1 (2.2) | Amine 1 (0.3) | PGMEA (1,200) |

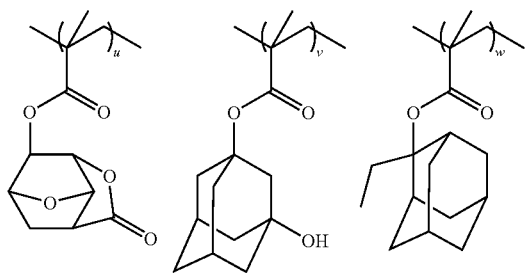

ArF single-layer resist polymer 1
(u = 0.40, v = 0.30, w = 0.30, Mw = 7,800)

Amine 1

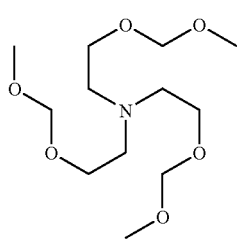

PAG 1

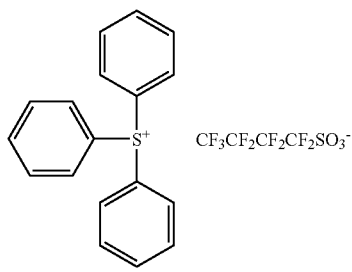

$CF_3CF_2CF_2CF_2SO_3^-$

Organic Solvent:

PGMEA=propylene glycol monomethyl ether acetate

A dry etching test was conducted. There were prepared undercoat layers (UDL-1 to 25, Comparative UDL-1 to 3) as used for the measurement of refractive index. These undercoat layers were examined by a test of etching with $CF_4/CHF_3$ gas using a dry etching instrument TE-8500P by Tokyo Electron, Ltd. A difference in thickness of the undercoat layer before and after the etching test was determined, from which an etching rate was computed. The results are shown in Table 3.

$CF_4/CHF_3$ Gas Etching Test

| Chamber pressure | 40.0 Pa |
|---|---|
| RF power | 1300 W |
| Gap | 9 mm |
| $CHF_3$ gas flow rate | 30 ml/min |
| $CF_4$ gas flow rate | 30 ml/min |
| Ar gas flow rate | 100 ml/min |
| Time | 60 sec |

TABLE 3

| Undercoat layer | $CF_4/CHF_3$ gas etching rate (nm/min) |
|---|---|
| UDL-1 | 82 |
| UDL-2 | 85 |
| UDL-3 | 90 |
| UDL-4 | 80 |
| UDL-5 | 90 |
| UDL-6 | 86 |
| UDL-7 | 92 |
| UDL-8 | 90 |
| UDL-9 | 88 |
| UDL-10 | 85 |
| UDL-11 | 82 |
| UDL-12 | 90 |
| UDL-13 | 90 |
| UDL-14 | 80 |
| UDL-15 | 88 |
| UDL-16 | 88 |
| UDL-17 | 85 |
| UDL-18 | 85 |
| UDL-19 | 83 |
| UDL-20 | 80 |
| UDL-21 | 86 |
| UDL-22 | 89 |
| UDL-23 | 86 |
| UDL-24 | 82 |
| UDL-25 | 77 |
| Comparative UDL-1 | 144 |
| Comparative UDL-2 | 120 |
| Comparative UDL-3 | 98 |

Profile of Resist Pattern on Low-k Substrate

Onto a silicon substrate, porous silica LK-0001 (Shin-Etsu Chemical Co., Ltd.) was spin coated and baked at 400° C. for 60 seconds to form a low-k insulating film having a dielectric constant of 2.5. The low-k film-coated substrate was immersed in a triethylamine solution and heated at 80° C. for 10 minutes for causing the low-k film to adsorb the amine component.

Onto the low-k film-coated substrate having the amine component adsorbed thereto in this way, each of the undercoat solutions UDL-1 to 25 and Comparative UDL-3 prepared above was coated and baked at 300° C. for 60 seconds to form a resist undercoat film of 200 nm thick. Coatings of Comparative UDL-1 and 2 were baked at 200° C. for 60 seconds to form resist undercoat films of 200 nm thick.

Onto each film of UDL-1 to 25 and Comparative UDL-1 to 3, the intermediate layer-forming material solution was coated and baked at 200° C. for 60 seconds to form a silicon-containing intermediate layer (SOG1) of 70 nm thick. Further, the solution of single-layer resist topcoat-forming material prepared above was coated and baked at 120° C. for 60 seconds to form a single-layer resist topcoat of 180 nm thick on the SOG1 film.

Thereafter, the resist layer was exposed using an ArF laser stepper S307E (Nikon Corporation, NA 0.85, σ0.93, ⅘ annular illumination, 6% halftone phase shift mask), then baked (PEB) at 110° C. for 60 seconds, and developed for 60 seconds with a 2.38 wt % aqueous solution of tetramethylammonium hydroxide (TMAH), thereby forming a positive 75 nm line-and-space pattern. The cross-sectional profile of the resist pattern was observed under electron microscope S-4700 (Hitachi, Ltd.). The results are shown in Table 4.

TABLE 4

| | Undercoat | Intermediate layer | Topcoat resist | Pattern profile |
|---|---|---|---|---|
| Example 1 | UDL-1 | SOG1 | SL resist for ArF | perpendicular |
| Example 2 | UDL-2 | SOG1 | SL resist for ArF | perpendicular |
| Example 3 | UDL-3 | SOG1 | SL resist for ArF | perpendicular |
| Example 4 | UDL-4 | SOG1 | SL resist for ArF | perpendicular |
| Example 5 | UDL-5 | SOG1 | SL resist for ArF | perpendicular |
| Example 6 | UDL-6 | SOG1 | SL resist for ArF | perpendicular |
| Example 7 | UDL-7 | SOG1 | SL resist for ArF | perpendicular |
| Example 8 | UDL-8 | SOG1 | SL resist for ArF | perpendicular |
| Example 9 | UDL-9 | SOG1 | SL resist for ArF | perpendicular |
| Example 10 | UDL-10 | SOG1 | SL resist for ArF | perpendicular |
| Example 11 | UDL-11 | SOG1 | SL resist for ArF | perpendicular |
| Example 12 | UDL-12 | SOG1 | SL resist for ArF | perpendicular |
| Example 13 | UDL-13 | SOG1 | SL resist for ArF | perpendicular |
| Example 14 | UDL-14 | SOG1 | SL resist for ArF | perpendicular |
| Example 15 | UDL-15 | SOG1 | SL resist for ArF | perpendicular |
| Example 16 | UDL-16 | SOG1 | SL resist for ArF | perpendicular |
| Example 17 | UDL-17 | SOG1 | SL resist for ArF | perpendicular |
| Example 18 | UDL-18 | SOG1 | SL resist for ArF | perpendicular |
| Example 19 | UDL-19 | SOG1 | SL resist for ArF | perpendicular |
| Example 20 | UDL-20 | SOG1 | SL resist for ArF | perpendicular |
| Example 21 | UDL-21 | SOG1 | SL resist for ArF | perpendicular |
| Example 22 | UDL-22 | SOG1 | SL resist for ArF | perpendicular |
| Example 23 | UDL-23 | SOG1 | SL resist for ArF | perpendicular |
| Example 24 | UDL-24 | SOG1 | SL resist for ArF | perpendicular |
| Example 25 | UDL-25 | SOG1 | SL resist for ArF | perpendicular |
| Comparative Example 1 | Comparative UDL-1 | SOG1 | SL resist for ArF | footing |
| Comparative Example 2 | Comparative UDL-2 | SOG1 | SL resist for ArF | space areas unremoved |
| Comparative Example 3 | Comparative UDL-3 | SOG1 | SL resist for ArF | footing |

The data of Table 4 demonstrate that when the undercoat-forming materials of Examples 1 to 25 are used, no profile changes due to footing or undercutting are found because the amine-contaminated underlying substrate produces no influence near the interface between the resist and the underlying. It is seen that rectangular patterns are available.

It is seen from Table 3 that when etched with $CF_4/CHF_3$ gas, the undercoat layers within the scope of the invention exhibit significantly slower etching rates than Comparative Examples using cresol novolac resin and polyhydroxystyrene. As seen from Table 4, the undercoat layers within the scope of the invention are effective for prohibiting any contamination from the amine-adsorbed low-dielectric-constant film and thus preventing the resist pattern from footing.

Japanese Patent Application No. 2008-276510 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photoresist undercoat-forming material comprising a novolac resin having an aromatic hydrocarbon group of 6 to 30 carbon atoms substituted with a sulfo group or an amine salt thereof;

wherein said novolac resin has the general formula (1):

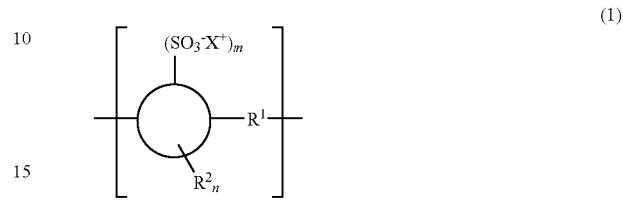

wherein X is hydrogen, an amine compound having hydrogen added thereto, or quaternary ammonium, $R^1$ is a single bond or a straight or branched $C_1$-$C_6$ alkylene group, the circle stands for an aromatic hydrocarbon group of 6 to 30 carbon atoms, R2 is selected from the group consisting of hydrogen, straight, branched or cyclic $C_1$-$C_{20}$ alkyl, $C_6$-$C_{20}$ aryl, $C_2$-$C_{20}$ alkenyl, straight, branched or cyclic $C_1$-$C_{20}$ alkoxy, amino, and hydroxyl groups, m is an integer of 1 to 4, and n is an integer of 1 to 3, and wherein said novolac resin further comprises recurring units derived from a compound having a non-conjugated double bond and free of a phenolic hydroxyl group.

2. The material of claim 1 wherein said novolac resin has a partial structure selected from the group consisting of naphthalenesulfonic acid, anthracenesulfonic acid, acenaphthenesulfonic acid, fluorenesulfonic acid, phenanthrenesulfonic acid, pyrenesulfonic acid, and ammonium salts of the foregoing acids.

3. The material of claim 1 wherein said novolac resin further comprises recurring units in novolac form of one or more compounds selected from the group consisting of phenol compounds, bisphenol compounds, and bisnaphthol compounds.

4. The material of claim 1, further comprising an organic solvent.

5. The material of claim 1, further comprising a crosslinker and an acid generator.

6. A patterning process comprising the steps of:
applying the photoresist undercoat-forming material of claim 1 onto a processable substrate to form an undercoat layer,
applying a photoresist composition onto the undercoat layer to form a photoresist layer,
exposing the photoresist layer in a predetermined region to radiation,
developing the photoresist layer with a developer to form a photoresist pattern, and
processing the undercoat layer and the substrate through the patterned photoresist layer as a mask, by means of a dry etching apparatus.

7. A patterning process comprising the steps of:
applying the photoresist undercoat-forming material of claim 1 onto a processable substrate to form an undercoat layer,
applying a silicon atom-containing intermediate layer over the undercoat layer,
applying a photoresist composition onto the intermediate layer to form a photoresist layer, exposing the photoresist layer in a predetermined region to radiation,
developing the photoresist layer with a developer to form a photoresist pattern,
processing the intermediate layer through the patterned photoresist layer as a mask,
removing the patterned photoresist layer, and
processing the undercoat layer and then the substrate through the processed intermediate layer as a mask,
the processing steps using a dry etching apparatus.

8. The patterning process of claim 7, wherein said photoresist composition comprises a silicon-free polymer, and the step of processing the undercoat layer includes dry etching with an oxygen-based etchant gas.

9. The patterning process of claim 7, wherein said processable substrate comprises a low-dielectric-constant film having a dielectric constant of up to 3.5 or a nitride film.

10. The material of claim 1 wherein the circle in formula (1) stands for benzene, naphthalene, anthracene, acenaphthene, fluorene, triphenylene, phenalene, phenanthrene, indene, indane, indacene, pyrene, chrysene, perylene, naphthacene, pentacene, coronene, heptacene, benzo[a]anthracene, dibenzophenanthrene or dibenzo[a,j]anthracene.

11. The material of claim 1 wherein X is hydrogen.

12. The material of claim 1 is wherein $R^2$ is hydrogen.

* * * * *